US005677538A

United States Patent [19]
Moustakas et al.

[11] Patent Number: 5,677,538
[45] Date of Patent: Oct. 14, 1997

[54] PHOTODETECTORS USING III-V NITRIDES

[75] Inventors: Theodore D. Moustakas, Dover; Mira Misra, Arlington, both of Mass.

[73] Assignee: Trustees of Boston University, Boston, Mass.

[21] Appl. No.: 499,710

[22] Filed: Jul. 7, 1995

[51] Int. Cl.⁶ .............................. H01L 21/20; H01L 21/26
[52] U.S. Cl. ...................... 250/370.12; 250/370.01; 250/370.02; 250/371; 250/372
[58] Field of Search ................... 250/370.01, 370.12, 250/320.02, 372, 371

[56] References Cited

U.S. PATENT DOCUMENTS

| | | |
|---|---|---|
| 3,829,556 | 8/1974 | Logan et al. |
| 4,144,116 | 3/1979 | Jacob et al. |
| 4,448,633 | 5/1984 | Shuskus . |
| 4,614,961 | 9/1986 | Khan et al. |
| 4,792,467 | 12/1988 | Melas et al. |
| 4,855,249 | 8/1989 | Akasaki et al. |
| 4,911,102 | 3/1990 | Manabe et al. |
| 4,948,751 | 8/1990 | Okamoto et al. ............ 437/107 |
| 5,076,860 | 12/1991 | Ohba et al. |
| 5,093,576 | 3/1992 | Edmond et al. |
| 5,122,845 | 6/1992 | Manabe et al. |
| 5,173,751 | 12/1992 | Ota et al. |
| 5,178,911 | 1/1993 | Gordon et al. |
| 5,182,670 | 1/1993 | Khan . |
| 5,210,051 | 5/1993 | Carter, Jr. |
| 5,218,216 | 6/1993 | Manabe et al. |
| 5,272,108 | 12/1993 | Kozawa . |
| 5,290,393 | 3/1994 | Nakamura . |
| 5,304,820 | 4/1994 | Tokunaga et al. |
| 5,306,662 | 4/1994 | Nakamura et al. |
| 5,323,022 | 6/1994 | Glass et al. |
| 5,385,862 | 1/1995 | Moustakas . |
| 5,409,859 | 4/1995 | Glass et al. |

FOREIGN PATENT DOCUMENTS

| | | |
|---|---|---|
| 3802732 | 8/1988 | Germany . |
| 4006449 | 9/1990 | Germany . |
| 59-135383 | 8/1984 | Japan ................ 250/370.12 |
| 64-30110 | 8/1989 | Japan . |
| 2-143420 | 6/1990 | Japan . |

OTHER PUBLICATIONS

Tavendale et al, High Resolution Nuclear Radiation Detectors from Epitaxial n–GaAs, Applied Physics vol. 17 No. 10, 15 Nov. 1970 pp. 427–429.

Kiode, et al., *Effect of an AlN Buffer Layer on AlGaN/ α–Al₂O₃ Heteroepitaxial Growth by MOVPE (in Japanese)* vol. 13, No. 4, 1986, pp. 218–225. no month.

S. Yoshida, et al., *Improvements on the electrical and luminescent properties of reactive molecular beam epitaxially grown GaN films by using Aln–coated sapphire substrates*, Appl. Phys. Lett. 42(5), Mar. 1983, pp. 427–429. H. Amano, et al., *Effect Of The Buffer Layer in Metalorganic Vapour Phase Epitaxy of GaN on Sapphire Substrate*, Thin Solid Films, 163, 1988, pp. 415–420.

H. Amano, et al., *Effect Of The Buffer Layer in Metalorganic Vapour Phase Epitaxy of GaN on Sapphire Substrate*, Thin Solid Films, 163, 1988, pp. 415–420. No month.

T. Nagatomo, et al., *Epitaxial Growth of GaN films by Low Pressure Metalorganic Chemical Vapor Disposition*, Abstract #1156, 104b Extended Abstracts Fall Meeting, Honolulu, Hawaii, Oct. 1987, p. 1602–1603.

(List continued on next page.)

*Primary Examiner*—Micheal J. Tokar
*Assistant Examiner*—Virgil O. Tyler
*Attorney, Agent, or Firm*—Baker & Botts, L.L.P.

[57] ABSTRACT

A photodetector using a III-V nitride and having predetermined electrical properties is disclosed. The photodetector includes a substrate with interdigitated electrodes formed on its surface. The substrate has a sapphire base layer, a buffer layer formed from a III-V nitride and a single crystal III-V nitride film. The three layers are formed by electron cyclotron resonance microwave plasma-assisted molecular beam epitaxy (ECR-assisted MBE). Use of the ECR-assisted MBE process allows control and predetermination of the electrical properties of the photodetector.

30 Claims, 17 Drawing Sheets

OTHER PUBLICATIONS

I. Akasaki, et al., *Effects of AlN Buffer Layer on Crystallographic Structure and On Electrical and Optical Properties of GaN and $Ga_2Al_2N$ ($0<x\leq0.4$) Films Grown on Sapphire Substrate by MOVPE*, Journal of Crystal Growth 98, 1989, pp. 209–219. no month.

I. Akasaki, et al., *Photoluminescence of Mg–doped p–type GaN and electroluminescence of GaN p–n junction LED*, Journal of Luminescenee 48 & 49, 1991, pp. no month.

Sitar, et al., *Design and performance of an electron cyclotron resonance plasma source for standard molecular beam epitaxy equipment*, Rev. Sci. Instrum. vol. 61, No. 9, Sep. 1990, pp. 2407–2411.

T. Lei, et al., *Epitaxial Growth of zinc–blende and wurtzitic gallium nitride thin films on (001) silicon*, Appl. Phys. Lett. 59 (8), Aug. 1991, pp. 944–946.

T. Lei, et al., *Epitaxial Growth and Characterization of zinc–blende gallium nitride on (001) silicon*, J. Appl. Phys. 71 (10), May, 1992, pp. 4933–4943.

T.D. Moustakas. et al., *A Comparative Stude of GaN Films Grown on Different Faces of Sapphire by ECR–Assisted MBE*, Mat. Res. Soc. Symp. Proc., vol. 242, 1992, pp. 427–432. no month.

T. Lei, et al., *A Comparative Study of GaN Epitaxy on Si(001 and SI(III) Substrates*, Mat. Res. Soc. Symp. Proc., vol. 242, 1992, pp. 433–439. no month.

C.R. Eddy, Jr., et al., *Growth of Gallium Nitride Thin Films By Electron Cyclotron Resonance Microwave Plasma–Assisted Molecular Beam Epitaxy*, J. App. Phys. 73, Jan. 1993, pp. 448–455.

J.S Foresi, et al., *Metal Contacts to Gallium Nitride*, Appl. Phys. Lett. 62 (22), May 31, 1993, pp. 2859–2861.

T. Lei, et al., *Heteroepitaxy, Polymorphism, and Faulting in GaN Thin Films on Silicon and Sapphire Substrates*, J. Appl. Phys. 74 (7), Oct. 1993, pp. 4430–4437.

M. Fanciulli, et al., *Conduction–electron spin resonance in zinc–blende GaN Thin Films*, Physical Review B, vol. 48, No. 20, Nov. 1993, pp. 15144–15147.

T.D. Moustakas. et al., *Growth and Doping of GaN Films by ECR–Assisted MBE*, Mat. Res. Soc. Symp. Proc., vol. 281, 1993, pp. 753–763. no month.

R.J. Molnar, et al., *High Mobility GaN Films Produced by ECR–Assisted MBE*, Mat. Res. Soc. Symp. Proc., vol. 281, 1993, pp. 765–768. no month.

T.D. Moustakas, et al., *Growth of GaN by ECR–Assisted MBE*, Physica B 185 (1993) pp. 36–49. no month.

M.S. Brandt, et al., *Hydrogenation of Gallium Nitride*, MRS Meeting, 1993, six pages. no date.

R. Singh, et al., *Intensity Dependence of Photoluminescence in GaN Thin Films*, Appl. Phys. Lett. 64 (3), Jan. 1994, pp. 336–338.

M.S. Brandt, et al., *Hydrogenation of p–type gallium nitride*, Applied Physics Letters, vol. 64, No. 17, Apr. 1994, pp. 2264–2266.

M.S. Brandt, et al., *Local Vibrational Modes in Mg–Doped Gallium Nitride*, Physical Review B. Condensed Matter, vol. 49, No. 20, May 1994, pp. 14,758–14,761.

H. Teisseyre, et al., *Temperature dependence of the energy gap in GaN bulk single crystals and epitaxial layer*, J. Appl. Phys. 76 (4), Aug. 1994, pp. 2429–2434.

S.N. Basu, et al., *Microstructures of GaN Films Deposited On (001) and (111) Si Substrates using Electron Cyclotron Resonance Assisted–Molecular Beam Epitaxy*, J. Mater. Res., vol. 9, No. 9, Sep. 1994, pp. 2370–2378.

R.J. Molnar, et al., *Growth of Gallium Nitride by Electron–Cyclotron Resonance Plasma–Assisted Molecular–Beam Epitaxy: The Role of Charged Species*, J. Appl. Phys. 76(8), Oct. 1994, pp. 4587–4595.

M. Leszcynski, et al., *Thermal Expansion of Gallium Nitride*, J. Appl. Phys. 76 (8), Oct. 1994, pp. 4909–4911.

R.J. Molnar, *Blue–Violet Light Emitting Gallium Nitride p–n Junctions Grown by Electron Cyclotron Resonance–assisted Molecular Beam Epitaxy*, Applied Physics Letters, Jan. 1995, three pages.

Larry F. Reitz, *High Responsivity UV Photoconductors Based On GaN Epilayers*, seven pages. no date.

M. Asif Khan, et al., *High–responsivity photoconductive ultraviolet sensors based on insulating single–crystal GaN epilayers*, Applied Physics Letters 60 (23), 8 Jun. 1992, pp. 2917–2919.

M. Asif Khan, *High Responsivity Photoconductive GaN Ultraviolet Detectors*, Microwave Journal, Nov. 1993, pp. 67–69.

K.S. Stevens, et al., *Photoconductive ultraviolet sensor using Mg–doped GaN on Si(111)*, Applied Physics Letter 66 (25), 19 Jun. 1995, pp. 3518–3520.

J.T. Glass, et al., *Diamond, Silicon Carbide and Related Wide Bandgap Semiconductors*, Materials Research Society Symposium Proceedings, vol. 162, 1990. pp. 525–530. no month.

*Bulletin of the American Physical Society*, Mar. 1991, vol. 36, No. 3, pp. 543–544.

H. Amano, et al., *Metalorganic vapor phaseepitaxial growth of a high quality GaN film using an AlN buffer layer*, Appl. Phys. Lett. 48 (5), 3 Feb. 1986.

Gopinath Menon, *Growth Of Intrinsic Monocrystalline Gallium Nitride Thin Films By Electron Cyclotron Resonance Microwave Plasma Assisted Molecular Beam Epitaxy*, Boston University College of Engineering, Master Thesis, 1990. no month.

Ting Lei, *Heteroepitaxial Growth of Gallium Nitride And Native Defect Formation In III–V Nitrides*, College of Engineering Doctoral Dissertation, 1993. no month.

Richard J. Molnar, *The Growth And Doping Of Gallium Nitride (GaN) Thin Films By Electron Cyclotron Resonance Plasma Assisted Molecular Beam Epitaxy (ECR–MBE)*, Boston University, College of Engineering Doctoral Dissertation, Jun., 1994.

Mira Misra, et al., *Photoconducting ultraviolet detectors based on GaN films grown by electron cyclotron resonance molecular beam epitaxy*, Submitted to SPIE Conference on 'X–ray and UV sensors and Applications', Presented at SPIE Annual Meeting, San Diego, Jul. 1995.

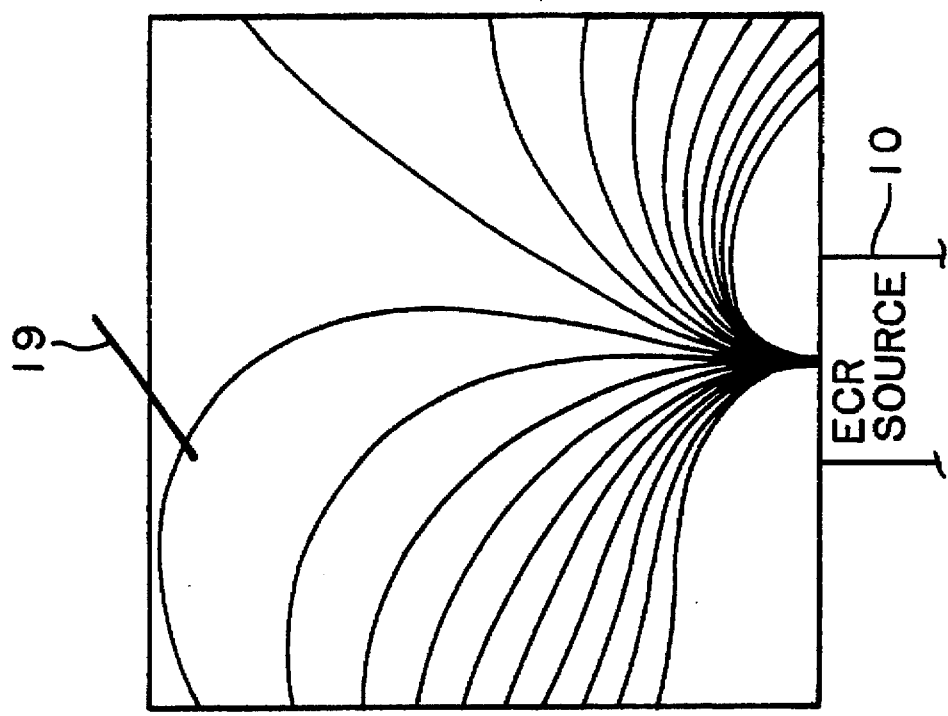
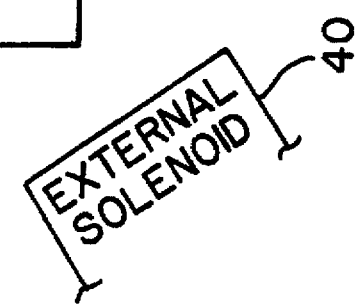
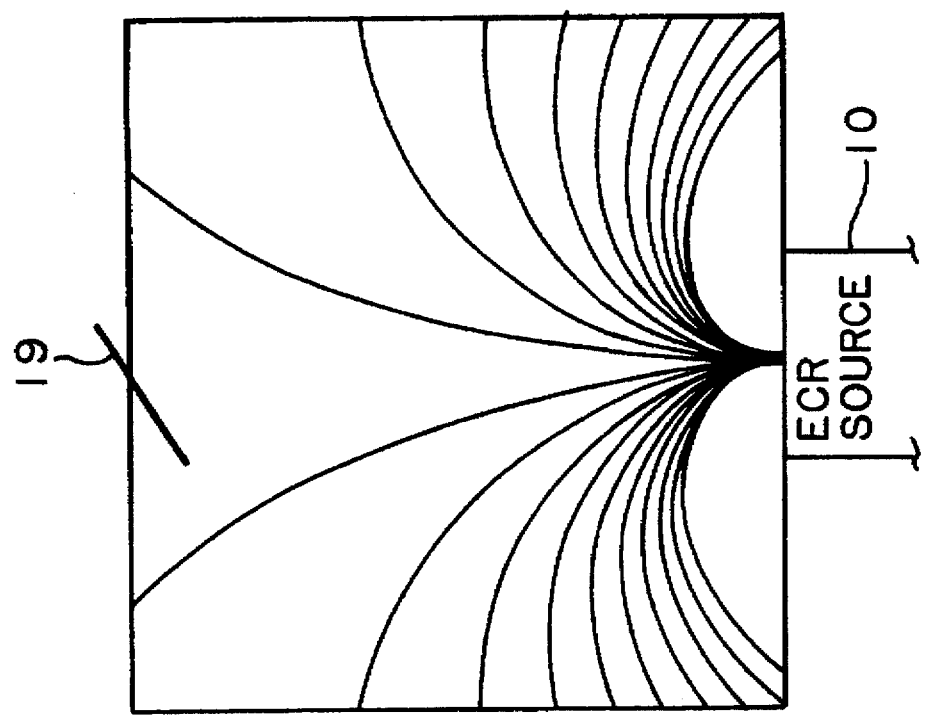
FIG. 5B
FIG. 5A

PHOTODETECTORS USING III-V NITRIDES

Portions of this invention were made with United States Government support under Grant No. DE-FG02-94ER81843 awarded by the Department of Energy, and the Government may have certain rights in the invention.

FIELD OF THE INVENTION

This invention relates to photodetectors. More specifically, this invention relates to photodetectors suitable for use in detecting radiations having wavelengths shorter than those of the visible spectrum.

BACKGROUND OF THE INVENTION

Photodetectors are broadly defined as devices which respond to incident electromagnetic radiation by converting the radiation into electrical energy, thereby enabling measurement of the intensity of the incident radiation. A photodetector typically includes some sort of photoconductive device and external measurement circuitry.

Photodetectors have many practical applications. For instance, photodetectors find use in scientific research (such as in scintillation detectors), in manufacturing (such as in devices to detect and prevent spoilage of products by light contamination), and in safety applications (such as in preventing overexposure of workers to certain radiations).

In many applications it is desirable to detect a particular type of light, i.e., a certain range of wavelengths. In such an application, light having a wavelength falling outside the range of wavelengths which is desired to be detected constitutes "noise" to the photodetector. Noise, can cause an erroneous response from the photodetector. Prior art UV photodetectors have the drawback that they tyically respond to visible light.

SUMMARY OF THE INVENTION

It is an object of the present invention to overcome these and other drawbacks of the prior art.

It is one object of the present invention to provide an ultraviolet (UV) light photodetector which is "blind" to visible light.

It is another object of the present invention to provide a UV photodetector fabricated using III-V nitrides preferably, GaN.

According to one embodiment, the present invention comprises a photoconductive device comprising GaN, that is preferably deposited on a substrate by electron cyclotron resonance microwave plasma-assisted molecular beam epitaxy (ECR-assisted MBE). The deposited GaN includes a buffer layer deposited on the substrate and a single crystal film deposited on the buffer layer. The electrical properties of the device are controlled by varying parameters of the deposition process.

A photodetector according to one embodiment of the present invention comprises a GaN device having predetermined electrical properties and first and second electrodes deposited on a surface of the device, the second electrode being spaced from the first electrode. A voltage source is connected across the first and second electrodes to create an electric field within the device. In operation, when the surface of the device upon which the electrodes are deposited is subjected to a photon emission, electron-hole pairs are created within the device and flow within the device because of the electric field.

In another embodiment, the present invention comprises a method of making a photodetector having predetermined electrical properties. The method comprises fabricating a GaN device having predetermined electrical properties of the device, depositing a first electrode on a surface of the device, and depositing a second electrode on the surface of the device, the second electrode being spaced from the first electrode. In a further step a voltage source is connected across the first and second electrodes.

BRIEF DESCRIPTION OF THE DRAWINGS

FIG. 5(a) is a schematic depiction of the flow of magnetic field lines emanating from an ECR source having no external solenoid.

FIG. 5(b) is a schematic depiction of the flow of magnetic field lines emanating from an ECR source when an external solenoid is used, according to one aspect of the present invention.

DETAILED DESCRIPTION OF THE PREFERRED EMBODIMENTS

Wide bandgap semiconductors, such as the III-V nitrides (i.e., GaN, InN, AlN) are useful for production of UV detectors because their large bandgap energies provide low noise and visible-blind detection. The III-V nitrides are an attractive class of materials for optoelectronic devices because they form a continuous alloy system whose direct bandgaps range from 1.9 eV (InN) to 3.4 eV (GAN) to 6.2 eV (AIN). Thus, the III-V nitrides enable fabrication of a visible-blind photodetector and offer the potential of fabricating optical devices which are sensitive over a broad range of electromagnetic radiation from red to ultraviolet and possibly to x-ray. In addition, they have high electron drift saturation velocities, high thermal stability and they are physically and chemically robust.

Figure 14:
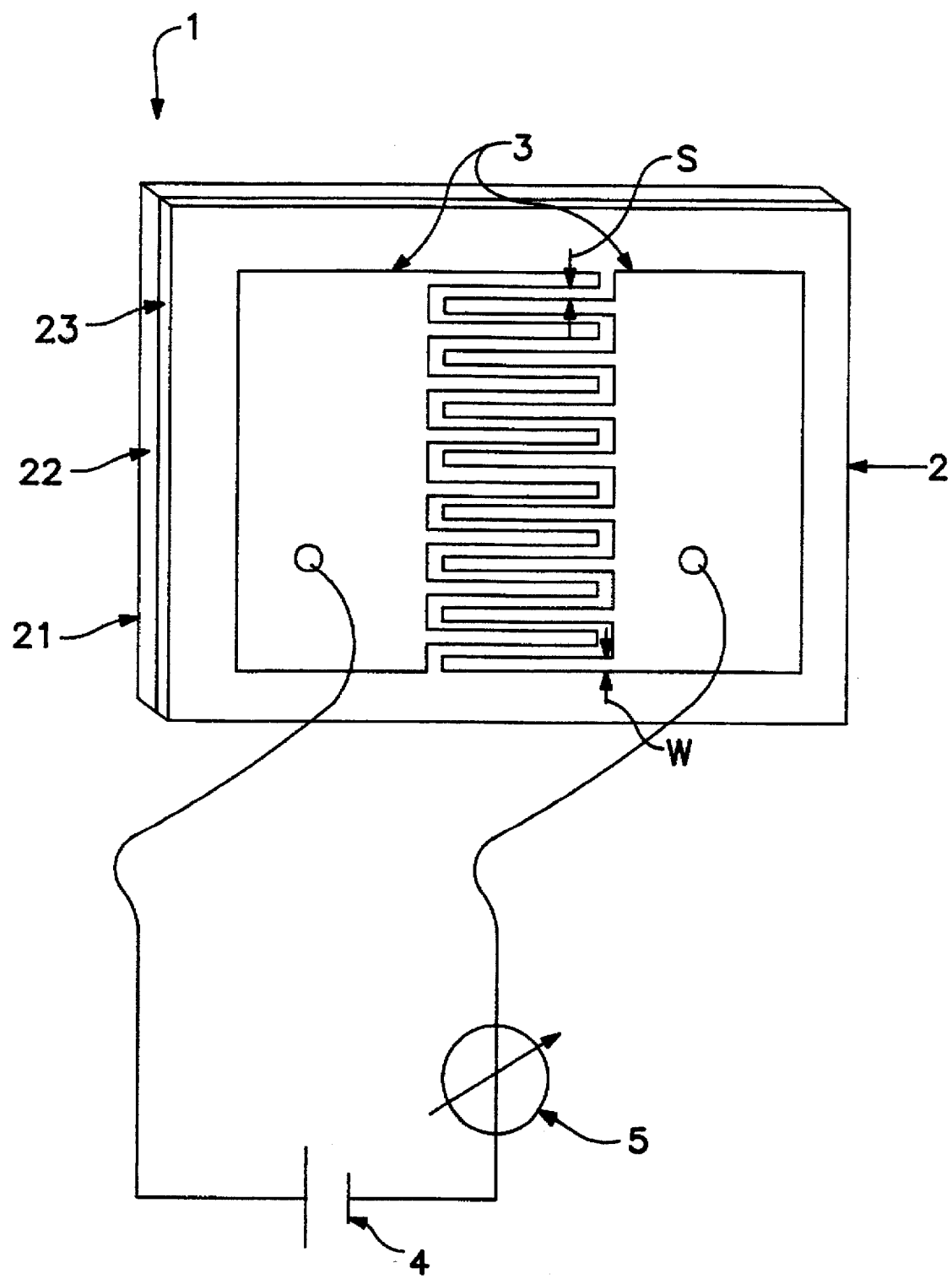
FIG. 14 schematically depicts a photodetector circuit according to one embodiment of the present invention.

One embodiment of a photodetector 1, according to the present invention is depicted in FIG. 14. Photodetector 1 includes a device 2 having interdigitated electrodes 3 formed thereon connected to external circuitry. The external circuitry comprises a biasing source 4, and a measurement instrument, such as a current meter 5. Biasing source 4 may be any suitable voltage source. In a preferred embodiment the source is a battery operating within the range of 5–25 volts. Current meter 5 may be any suitably sensitive current meter. In one embodiment a Kiethley Model 614 is used.

In operation, photons (in the form of incident light) strike the surface of device 2. Photons of suitable wavelength are absorbed and give rise to electron hole pairs (one for every photon absorbed) within device 2. The electrical conductivity of device 2 increases in proportion to the photon flux (photons per second). An external electric field, generated by application of the bias voltage from source 4, causes the electrons and holes to be transported within the device, thereby giving rise to a current in the external circuitry which is measurable by current meter 5.

Device 2 consists of a film of a III-V nitride formed on a substrate. The III-V nitride film may comprise one or more single crystal layers and is preferably formed by electron cyclotron resonance microwave plasma-assisted molecular beam epitaxy (ECR-assisted MBE). Depending on the material used for the substrate, a buffer layer may be used between the substrate and the single crystal layer. That is, where the lattice mismatch, as defined by the lattice constants and the crystal structure of the substrate and the single crystal layer is large, a buffer layer may be used in order to form the single crystal layer on the substrate. Where the lattice constant and the crystal structure of the substrate and single crystal layer are about the same, a buffer layer is not necessary. As an illustration, if the III-V nitride film to be used is a GaN film and the substrate to be used is sapphire, there is a lattice mismatch of about 15%, and a buffer layer may be used to achieve proper epitaxy, for example, proper two-dimensional growth. In contrast, if, for example, SiC or ZnO, were used as a substrate, the lattice mismatch is only about 3%, and a buffer layer is unnecessary.

According to one embodiment, device 2 comprises three layers including a base substrate 21, a buffer layer 22 and a film 23. Base substrate 21 is a single crystal sapphire substrate whose surface, after chemical cleaning and thermal outgassing, is converted to AlN by exposing it to an electron cyclotron resonance (ECR) activated nitrogen plasma. This process is referred to as nitridation and is explained in more detail below. Buffer layer 22 is preferably deposited at a temperature between 100° C. and 550° C. to a thickness of about 100 Å to about 1000 Å. Film 23 is preferably deposited at a temperature of about 600° C. to about 900° C. to a thickness of about 1000 Å to about several micrometers. Layers 22 and 23 are preferably GaN deposited by ECR-assisted MBE. Other processes (for instance, metal-organic vapor phase epitaxy, MOVPE) could also be used to grow the films. Interdigitated electrodes 3 are then patterned on the films using standard photolithographic and lift-off techniques. Thereafter, the surface of device 2 is coated with an antireflective coating.

Use of the ECR-assisted MBE process has certain advantages over other deposition processes. The ECR-assisted MBE process allows control of the resistivity of device 2 by varying process parameters such as microwave power and the flow rate of the $N_2$ source. This control of the resistivity of device 2 allows electrical properties of the photodetector, such as gain and response speed to be controlled. Generally, if a fast response time is desired from a photodetector, a device with greater resistance is used. The correlation between gain and resistivity is explained in greater detail below.

Another advantage to the use of ECR-assited MBE is that it produces near intrinsic GaN. Other processes that may be used to deposit GaN have resulted in GaN which is unintentionally doped n-type. This unintentional doping of GaN has been attributed to the formation of nitrogen vacancies in the GaN lattice. GaN decomposes (and loses nitrogen) at about 650° C. Many growth processes take place at temperatures exceeding 650° C. (for instance, MOCVD of GaN typically takes place at temperatures exceeding 1000° C.) and therefore, the growth process itself provides sufficient thermal energy for vacancy formation. Growth processes at lower temperatures should reduce the number of nitrogen vacancies in the lattice, prevent the unintentional n-type doping of the GaN lattice and result in intrinsic GaN.

ECR-assisted MBE used in preferred embodiments of the present invention, forms GaN at significantly lower processing temperatures using an activated nitrogen source. An ECR microwave nitrogen plasma is the preferred activated nitrogen source. A two step heating process permits the formation of monocrystalline GaN at lower processing temperatures.

Figure 1:
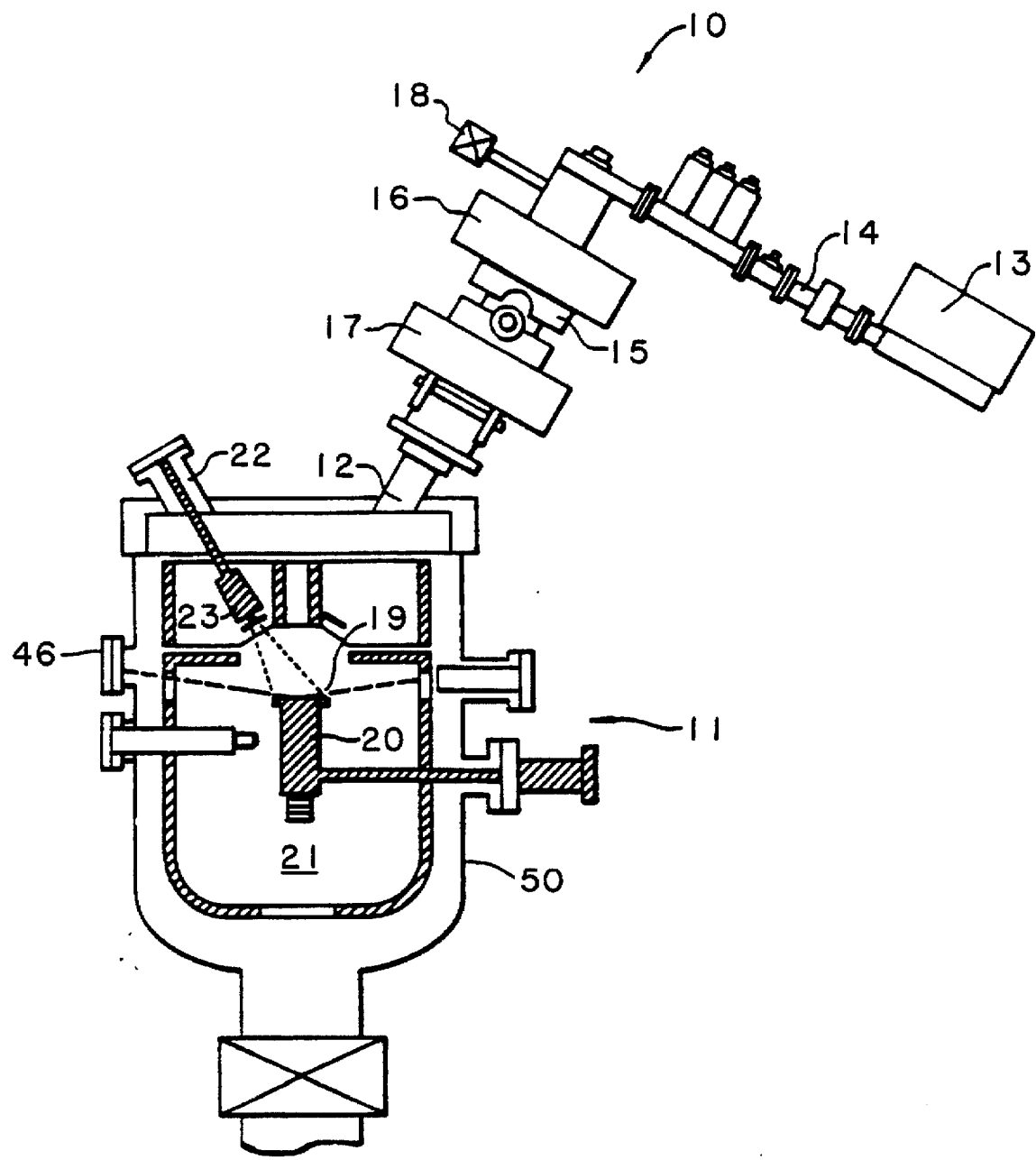
FIG. 1 is a cross-sectional view of an ECR-assisted MBE growth chamber.

One embodiment of an ECR-assisted MBE system which may be used to fabricate device 2 of the present invention is shown in FIG. 1. An ECR-system 10 is integrated with an MBE system 11 by attaching the ECR system 10 to an effusion port 12. ECR system 10 may be an AsTeX model-1000 ECR source, for example. The ECR system 10 includes a microwave generator 13, a waveguide 14, a high vacuum plasma chamber 15, and two electromagnets 16 and 17. The microwaves at 2.43 GHz are created in the microwave generator 13 and travel down the rectangular waveguide 14. The microwave power (100–500 W) passes from the waveguide 14 into the plasma chamber 15. Nitrogen flows into the plasma chamber 15 through a mass flow controller 18. The mass flow controller 18 maintains an adjustable constant flow rate. The plasma chamber 15 is surrounded by the two electromagnets 16 and 17. The upper magnet 16 is powered by a 2 kW power supply (not shown) and the lower magnet 17 is powered by a 5 kW power supply (not shown). Positioning of the electromagnets in this way results in a more intense and stable plasma.

Upper electromagnet 16 sets free electrons in chamber 15 into cyclotron orbits. The cyclotron frequency is dependent upon the strength of the magnetic field and the electron charge-to-mass ratio. Since all the electrons assume cyclotron orbits, the energy lost in random motion and collisions is reduced. Additionally, the plasma will be confined to the center of the chamber 15. The magnetic field is adjusted such that the frequency of oscillation of the microwaves is exactly equal to the cyclotron frequency of the electrons. Nitrogen ($N_2$) is then introduced into the chamber through the mass flow controller 18 and part of it is decomposed into atomic and ionic nitrogen and another part of it is converted into excited molecular nitrogen ($N_2$*) by impact with the high energy electrons. Atomic nitrogen species and excited molecular species are known as neutral excited species. The lower electromagnet 17 then guides the ions through the effusion port 12 towards a substrate 19 which is positioned on and supported by a continuous azimuthal rotation (C.A.R.) unit 20 in a growth chamber 21 of the MBE system 11. The growth chamber 21 is located in a housing 50 into which the effusion ports are connected. The C.A.R. 20 can be rotated between 0 and 120 rpm. On certain substrates, GaN films grow in the wurtzite structure and on others in the zincblende structure. Such substrates include for example sapphire (GaN in wurtzitic structure) and Si(100) (GaN in zincblende structure). Gallium flux is generated in a Knudsen effusion cell 22.

In a typical process, the substrate 19 is sputter-etched by the nitrogen plasma at about 600° C., for example. Other high temperatures, from about 600° C. to about 900° C., for example, may also be used. This process effects nitridation. Nitridation is a process in which sapphire ($Al_2O_3$) is bombarded with nitrogen at relatively high temperatures. The nitrogen replaces the oxygen on the surface of the sapphire and creates atomically smooth AlN. After nitridation, the substrate is cooled down to 270° C. in the presence of the nitrogen plasma. A gallium shutter 23 is then opened to deposit the initial buffer layer of GaN. The use of an activated nitrogen source permits the deposition of GaN at this low temperature. The buffer layer is allowed to nucleate over ten minutes, for example, and then the gallium shutter 23 is closed to stop the nucleation of the film. The substrate is then brought slowly to 600° C. at the rate of 4° C. every 15 seconds in the presence of the nitrogen plasma. The nitrogen overpressure also helps reduce the formation of nitrogen vacancies.

Once at 600° C., the substrate 19 is kept at this temperature for 30 minutes in the presence of nitrogen plasma to ensure that the GaN buffer layer crystallizes. The gallium shutter 23 is opened once again to grow the GaN monocrystalline film. The thickness of the film is preferably about 1 μm, although in theory there is no limitation to film thickness. Nitrogen pressure and gallium flux are kept constant during the entire process.

The two step growth process allows for the nucleation of a buffer layer. The buffer layer is grown at a temperature in the range of 100° C.–400° C. but a range of about 100° C. to about 550° C. may also be used. Up to about 400° C., the nucleation layer is mostly amorphous. At about 400° C., the layer becomes crystalline with defects due to stacking faults and misoriented domains. If an amorphous nucleation layer is grown, the layer should be relatively thin (e.g. about 100–200 Å), but should completely cover the substrate. On some instances, thinner buffer layers are desirable because subsequent crystallization of a thin amorphous nucleation layer will be more efficient and will not take as much time as a thicker amorphous layer would. An advantage of using a temperature that causes an amorphous layer is that amorphous layers more readily uniformly cover the entire substrate.

At higher temperatures, such as between about 400° C. and about 550° C., for example, GaN layers are crystalline, though slightly defective. Due to the growth mode at these temperatures being either columnar or three-dimensional, these layers may need to be slightly thicker to ensure complete coverage of the substrate. Slightly defective crystalline buffer layers may be grown from about 200 Å to about 1000 Å, for example.

After the nucleation step, the temperatures increased to a high temperature level to perform a growth step. At these higher temperatures from about 600° C. to about 900° C., for example, amorphous buffer layers crystallize and crystallinity of the defective crystalline buffer layers improves. Since thinner amorphous buffer layers crystallize at a faster rate than do thicker amorphous buffer layers, it may be desirable to sustain the temperature in the chamber at a temperature higher than the nucleation temperature for a period of time before beginning the growth step to ensure the desired crystallization of the nucleation layer. After the amorphous buffer layer has crystallized, or the defective crystalline nucleation layer undergoes further recrystallization, any further growth takes place on the crystallized GaN buffer layer. A useful method of monitoring the crystallization, the surface morphology of the buffer layer, and the final film is Reflection High Energy Electron Diffraction (RHEED). The films grown by this two step process are superior to those grown by a one step growth process.

Figure 2A:
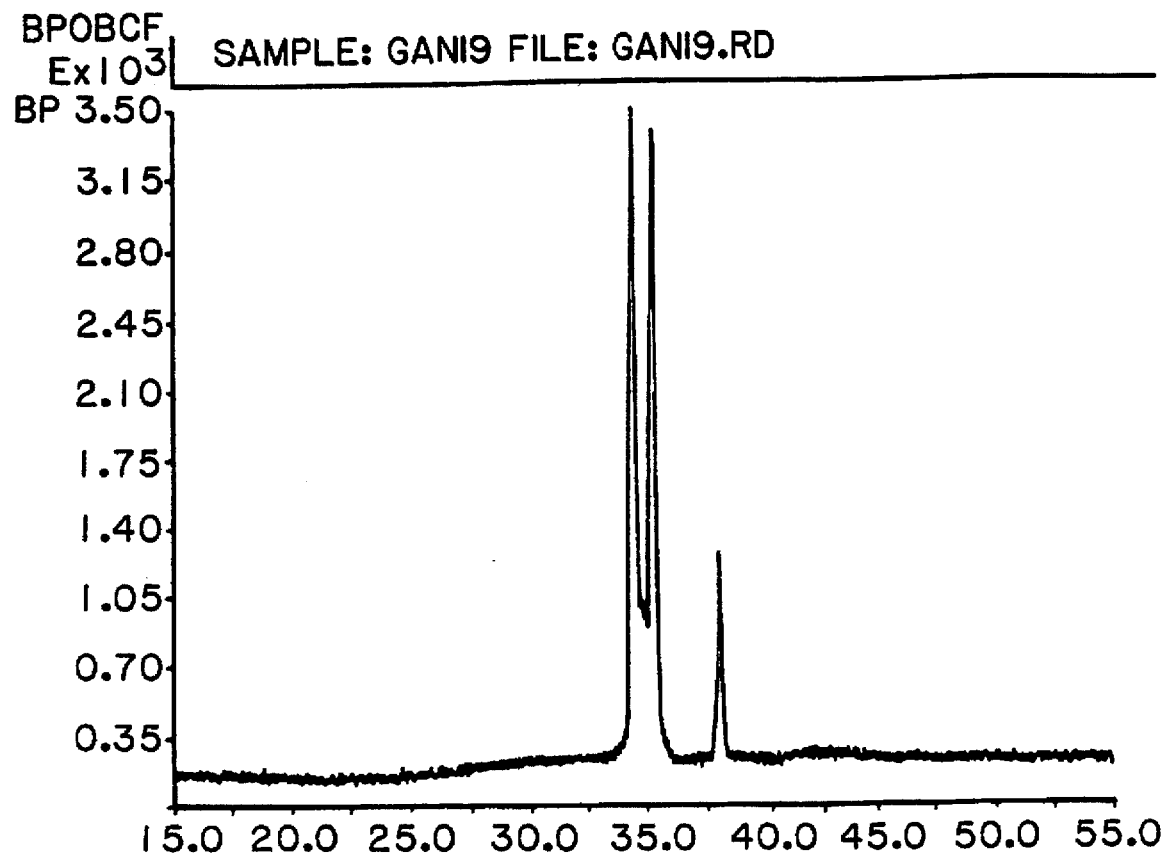
FIG. 2a is an X-ray diffraction pattern from a GaN film on (11-20) sapphire grown from a one-step process.
Figure 2B:
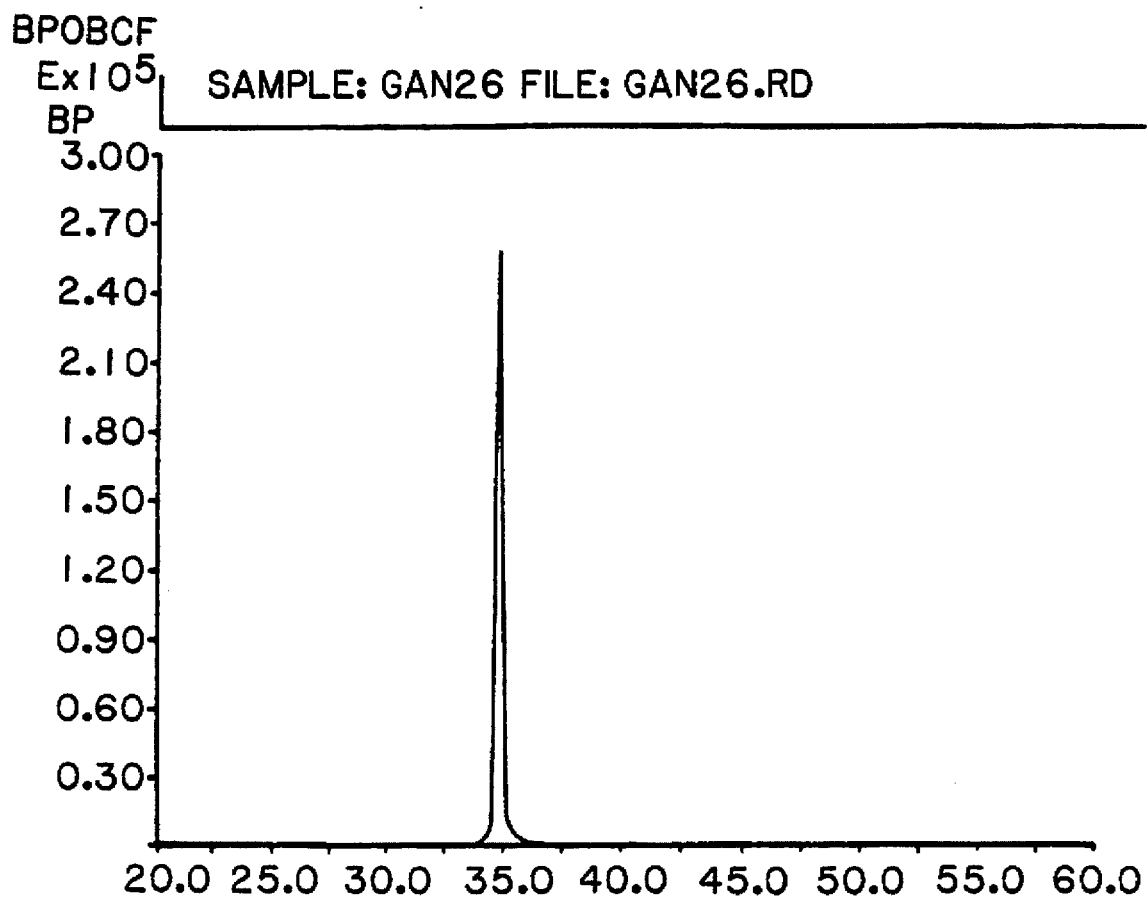
FIG. 2b is an X-ray diffraction pattern from a GaN film on (11-20) sapphire grown from a two-step process.

FIG. 2 shows the X-ray diffraction (XRD) pattern of a GaN film grown on the α-plane of sapphire (11–20) in a one-step process (FIG. 2A) and a two step process (FIG. 2B). The two peaks at about ca. 2θ=35° of FIG. 2A are attributed to a defective GaN crystal. FIG. 2B has a single peak indicating a film of better quality. This is because the majority of the film grows on the top of the GaN buffer and does not contact the underlying substrate. The growth layer of GaN "recognizes" the GaN buffer layer on which it can grow without defects. The buffer is the only part of the film which is highly defective. Films grown by the method described above can be highly resistive at room temperature ($10^{12}$ Ω-cm).

Figure 3:
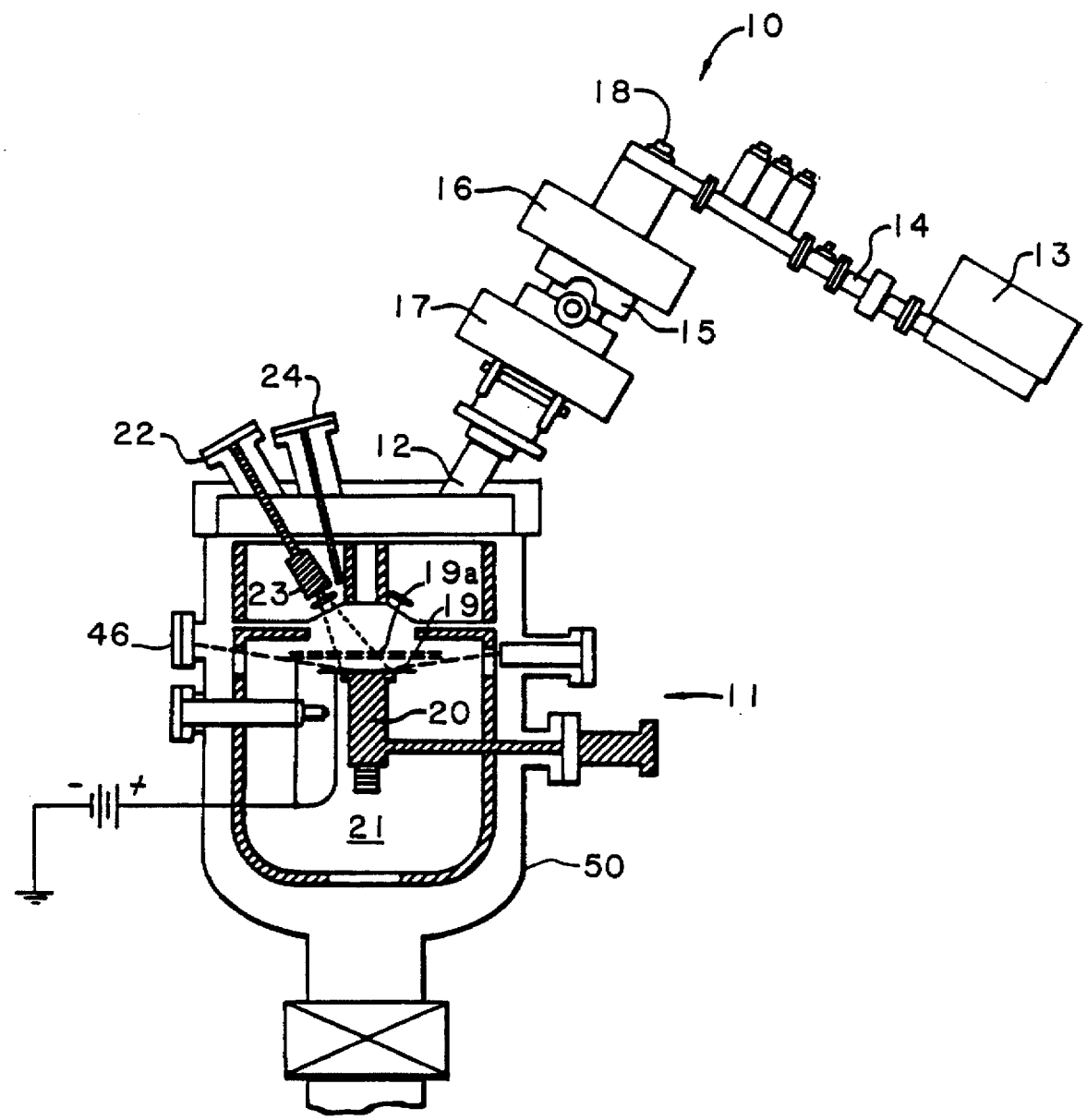
FIG. 3 is a schematic illustration of a device for doping GaN films.

The growth process described above results in GaN which is substantially intrinsic. The GaN may be doped either n-type or p-type by incorporating the proper impurities, as described above. For instance, silicon may be used as an n-type dopant. Alternatively, the GaN may be autodoped with nitrogen vacancies. The carrier concentration of the doped GaN may vary from about $10^{13}$ about $10^{19}$ cm$^{-3}$. Doping is generally carried out by incorporating the proper impurities in their charged state. This is because the energy to incorporate a charged impurity into the lattice is lower than the energy needed to incorporate a neutral impurity. FIG. 3 is a schematic illustration of an apparatus for incorporating a charged acceptor or donor into the GaN lattice. The substrate 19 or a grid 19a, directly in front of the substrate 19, is positively biased. FIG. 3 shows both substrate 19 and grid 19a connected to a voltage source. In practice of this invention, either substrate 19 or grid 19a may be positively biased. Electrons are therefore attracted to the substrate surface, while positive ions such as $N^+$ are repelled. The growth process is carried out as described above with addition of an acceptor source 24 so that gallium, nitrogen and acceptors are deposited on the electron-rich surface of the substrate. As the acceptor atom approaches the surface, it takes on an electron and is incorporated into the lattice as a negative species. The same procedure is used to dope the GaN lattice with donor impurities, except that a negative bias is used on the substrate or the grid.

Alternatively, a charged surface can be generated by bombarding the substrate with electrons or positive ions. Electron guns and ion guns, respectively, are conventional sources of these species.

Suitable acceptor species include, but are not limited to, zinc, magnesium, beryllium, and calcium. Suitable donor species include, but are not limited to, silicon, germanium, oxygen, selenium, and sulfur.

Figure 4:
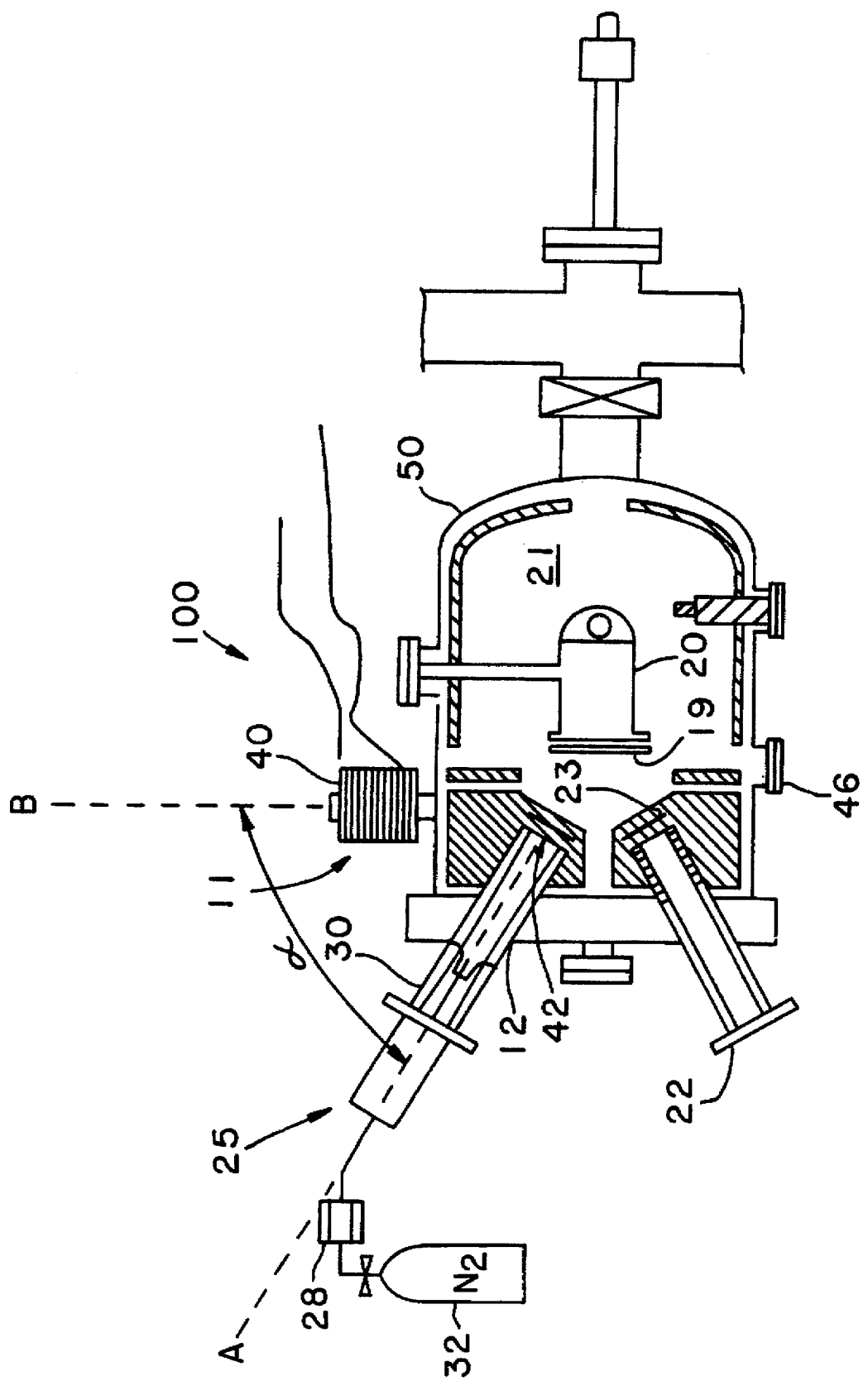
FIG. 4 is a cross-sectional view of one embodiment of an ECR-assisted MBE growth chamber.

In another embodiment of the present invention, a compact ECR source may be used to fabricate device 2 of FIG. 14. FIG. 4 depicts a compact ECR-assisted MBE device 100 having a compact ECR-system 25 mounted in a Knudsen effusion cell 30. Thus, this source generates a nitrogen plasma closer to the substrate 19 than a conventional ECR source. Compact ECR-system 25 has an axial solenoid (not shown) to generate the magnetic field used for ECR operation. Compact ECR-system 25 is supplied with nitrogen via nitrogen supply 32. The nitrogen is first purified in nitrogen purifier 28 before entering compact ECR-system 25. Compact ECR-system 25 may be an AsTeX compact ECR source, for example. Compact ECR-system 25 is preferably lightweight, relatively inexpensive compared to traditional ECR sources and operates at much lower microwave powers than a traditional ECR-source, such as the AsTeX model 1000 ECR source, for example. Compact ECR-system 25 uses a microwave power for the growth of GaN films in the range of about 10–100 W. This range of microwave power leads to power densities which are approximately equal to those resulting from operating traditional ECR sources in the range of about 100–500 W.

According to another aspect of this invention, an external solenoid may also be used. FIG. 4 depicts an ECR-assisted MBE device 100 with an external solenoid 40 attached thereto. However, ECR-assisted MBE device 100 may be operated without external solenoid 40 or operated with external solenoid 40 having no current. Further, external solenoid 40 may also be used with ECR-source 10 depicted in FIGS. 1 and 3, or other activated nitrogen sources.

External solenoid 40 is a magnetic device designed to induce a magnetic field. Preferably the magnetic field induced by external solenoid 40 is opposite in sign with respect to substrate 19 to that of the magnetic field generated by the ECR source. External solenoid 40 may be powered by a dc power supply (not shown), for example, to induce the desired magnetic field. External solenoid 40 may comprise a plurality of turns of copper magnet wire wound on a mandrel. For example, 2300 turns of 18 gauge enameled copper magnet wire wound on an iron mandrel may be used. The number of turns, type of wire, and construction of the solenoid may be varied. Preferably, external solenoid 40 is powered by a current of about 5–8 amps. Other amperages may also be used, such as from about 0–10 amps.

As depicted in FIG. 4, external solenoid 40 is preferably disposed outside the housing of the high vacuum plasma chamber 15 of MBE system 11. External solenoid 40 is preferably disposed along an axis B, which is preferably disposed at an angle $\alpha$ with respect to an axis A through ECR-system 25. In a preferred embodiment, angle $\alpha$ is about 60°. Other values for angle $\alpha$ may also be used. Additionally, external solenoid 40 is preferably disposed at a reasonable distance from the magnetic coil in the ECR source to avoid unwanted interference in the ECR source. In order for the ECR source to operate properly, a 875 Gauss magnetic field is used. If the external solenoid 40 is too close to the magnetic source in the ECR source, this field may be effected.

In operation, charged species in ECR plasmas are strongly guided along magnetic field lines or, equivalently, down the divergence of the magnetic field by ambipolar diffusion. Thus, the charged nitrogen species travel down the compact ECR-system 25 through the effusion port 12 along the magnetic field lines generated by the ECR magnetic source toward substrate 19. External solenoid 40 alters the direction of the charged species (ionic species) which are produced from compact ECR-system 25. Further, because of the relatively large separation between the external solenoid 40 and the compact ECR-system 25, there is negligible perturbation of the magnetic field inside the ECR-system 25 due to the external solenoid 40 magnetic field. Therefore, the effect on the species generated in the compact ECR-system 25 is negligible.

FIG. 5 depicts the effects of an external solenoid 40 on the direction of the charged species. FIG. 5A shows magnetic field lines produced from an ECR source without use of an external solenoid 40. As this figure shows, the field lines are symmetrically directed toward substrate 19. FIG. 5B shows magnetic field lines produced form an ECR source with an external solenoid 40 in use. The external solenoid 40 serves to divert the field lines away from the substrate area. Therefore, by varying the power and position of external solenoid 40 it is possible to selectively control the amount of and the ratio of ions to excited neutral species and atomic species at the substrate. The use of the external solenoid provides a scalable process. By controlling the effective magnetic current of the external solenoid 40, the ion density at the substrate may be altered. Ion density at the substrate may be important because ions at high energies may cause damage to the growth layer. Therefore, by reducing the amount of ions at the substrate, the likelihood of such damage is correspondingly reduced.

Figure 6:
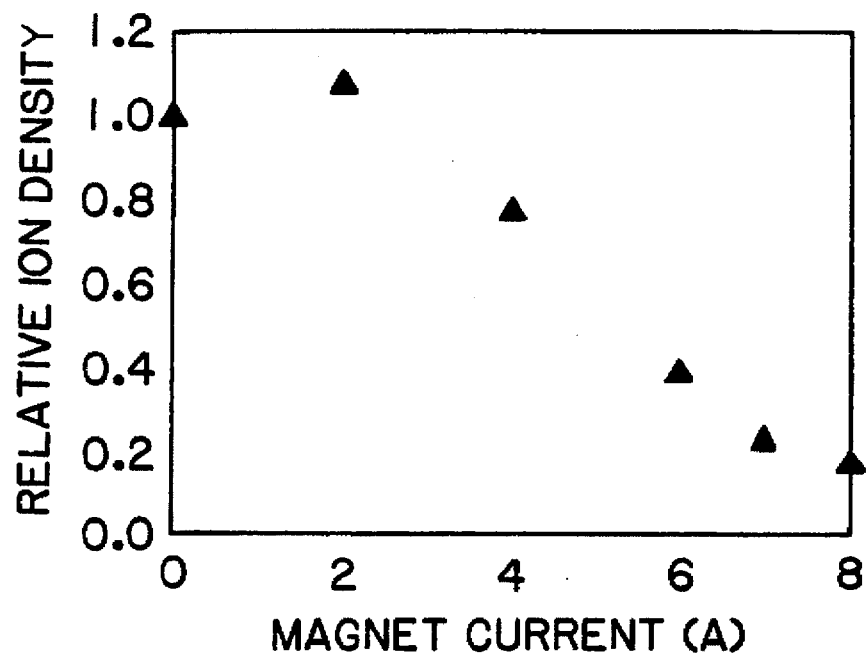
FIG. 6 is a graph showing the effects of variations in the magnet current for an external solenoid and the relative ion density at the substrate.

FIG. 6 depicts one example of how varying the magnetic current of the external solenoid 40 relates to relative ion density. By replacing the substrate 19 with the collector of a nude ionization gauge (Bayard-Alpert type) and using it as a Langmuir probe, the relative ion density as a function of the magnetic current of external solenoid 40 may be measured. FIG. 6 illustrates the scalability of the growth process through the variation of the magnetic current of the external solenoid.

Figure 7:
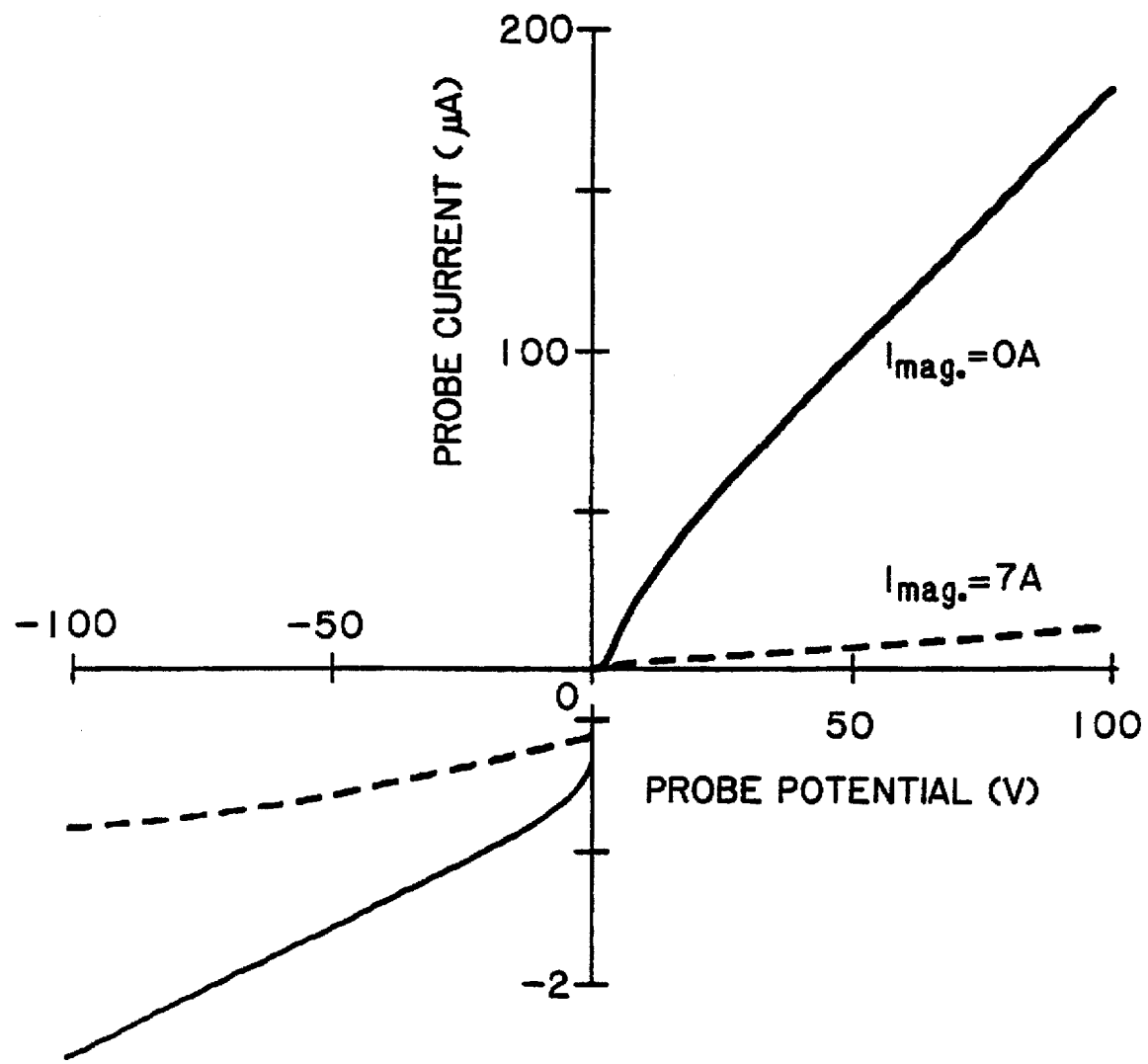
FIG. 7 is a graph showing the I-V characteristics of a Langmuir probe operating in a device according to one aspect of the invention.

FIG. 7 depicts an I-V characteristic of the Langmuir probe used above operated with external solenoid 40 having a current of 7A and without external solenoid 40. FIG. 7 illustrates that activation of external solenoid 40 results in the reduction of both electron and ion densities at the substrate 19 surface.

Films grown with the external solenoid 40 have improved surface morphology, and transport and photoluminescence properties. These differences are attributed to the reduced number of ions in the nitrogen plasma. By using an external solenoid 40, substantially higher quality films may be grown. This external solenoid thus provides a simple, effective, and unobtrusive method of extracting and controlling charged species, particularly where energetic anisotropies of the ionic species resulting from magnetic-field effects make biasing schemes difficult to interpret.

Figure 8:
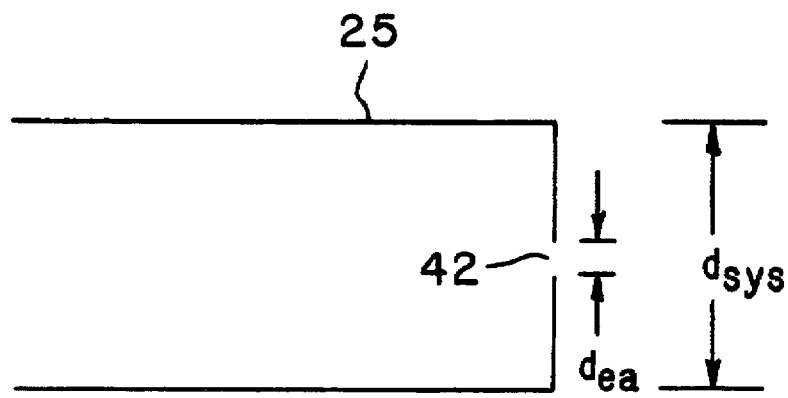
FIG. 8 is a schematic illustration of an effusion cell exit aperture according to one aspect of the present invention.

In another embodiment of the present invention, high energy ion damage may be reduced through the use of at least one reduced diameter exit aperture at the exit of the ECR-system. Compact ECR-system 25 may be provided with exit apertures 42 at its exit as depicted in FIGS. 4 and 8. Exit apertures 42 may be formed from a disc (not shown) having a hole or a plurality of holes disposed therein. The disc may be placed between the ECR system's liner and a wafer spring, which holds both the liner and the disc in place. The ECR system having the disc at its exit is then placed in effusion port 12. The disc may be made of quartz, for example, and may have a thickness of about 1 mm, for example. Other devices for reducing the diameter of the exit of the ECR system may also be used such as a remotely controlled shutter, for example. By using a remotely controlled device, operation of exit apertures 42 may be varied during operation.

The material used for construction of the ECR source and its liner may also be important in reducing impurity concentration and nitrogen recombination. Materials wich may be used include, for example, pyrolytic boron nitride, aluminum, tungsten, molybdenum or other metals or insulators.

Exit apertures 42 preferably have a diameter, $d_{ea}$, less than the diameter of the ECR-system 25, $d_{sys}$, as shown in FIG. 8. For example, the ECR-system diameter, $d_{sys}$, may be about 2 cm while the diameter, $d_{ea}$, may be varied from about 1 mm to about 1.9 cm, for example, although other diameters may also be used.

By reducing the diameter of the exit of the ECR-system 25, the pressure inside the ECR system 25 is increased. Conversely, increasing the diameter decreases the pressure. Increased pressure promotes collisions between the ions of the plasma. These collisions tend to reduce the energy of the ions and reduce the amount of ionic species which exit the ECR system 25. Any ions that exit the ECR-system 25 have reduced energy and are not as likely to cause damage to the GaN growth layer. If the diameter of the exit apertures 42 is small enough, no ions escape due to a screening effect. The diameter at which "screening" occurs is known as the Debye screening length. Atomic nitrogen particles, however, pass through this "screen". Atomic nitrogen species are preferred for forming GaN layers.

Controlling the diameter of exit apertures 42 allows control of the amount of ionic species and the ionic energy at the substrate. A smaller hole passes fewer ions and ions with reduced energies. In some applications, it may be desirable to provide for more than one aperture 42 in the exit of ECR-system 25. By controlling the diameter of the apertures used (for instance, maintaining diameters less than the Debye length), pressure within the system is still increased and high energy ion damage is reduced. Using multiple apertures, however, does not unduly restrict the flow of $N_2$ into growth chamber 21. The exit aperture 42 may be used with or without external solenoid 40. Also, the exit aperture 42 may be used with any suitable type of ECR system or other activated nitrogen source to vary the ionic energy directed at the substrate. By using both exit apertures 42 and external solenoid 40, greater flexibility in controlling the growth process can be provided.

Figure 9:
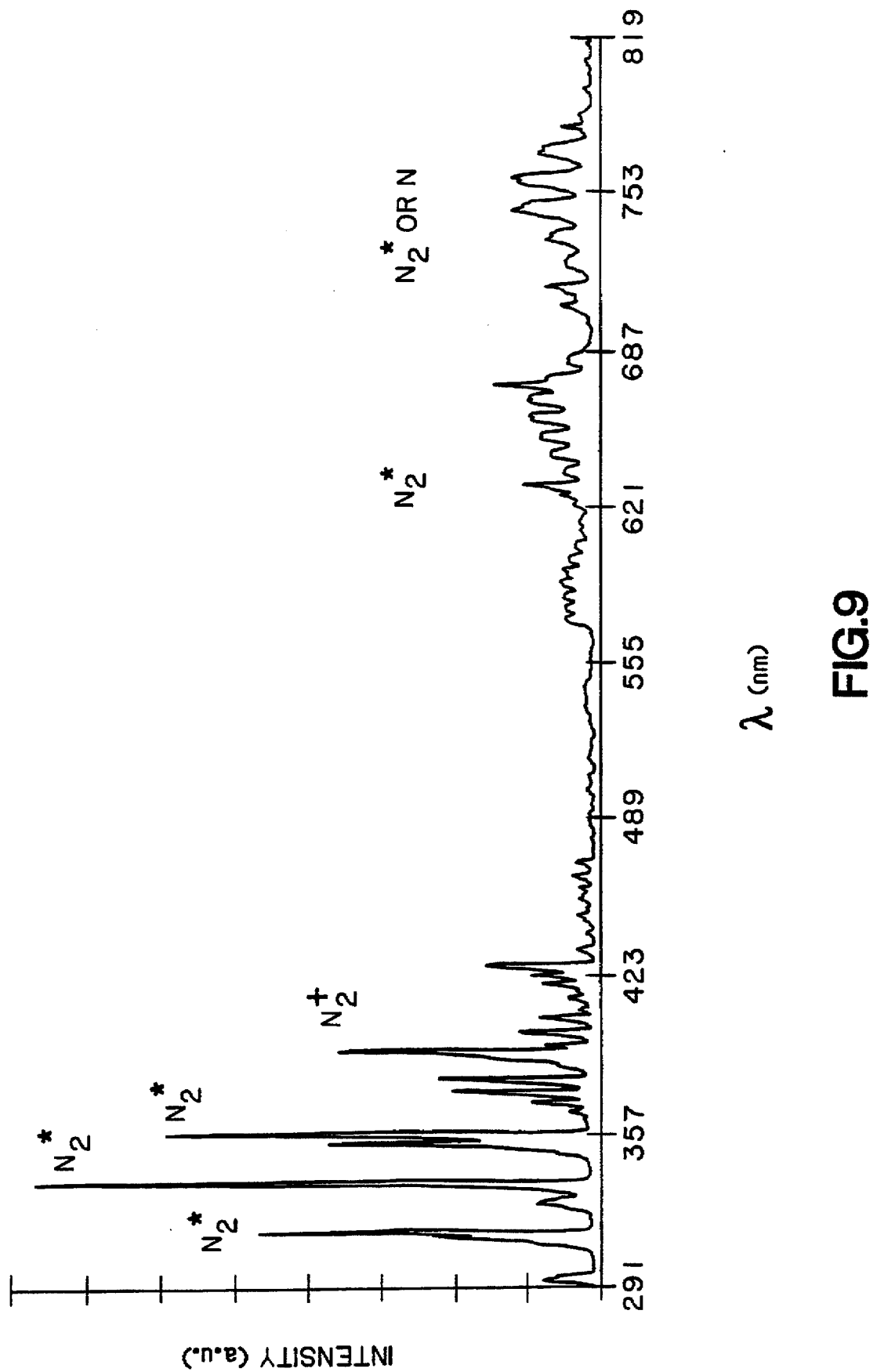
FIG. 9 is a graph illustrating an optical emission spectra for an ECR nitrogen plasma source.
Figure 10:
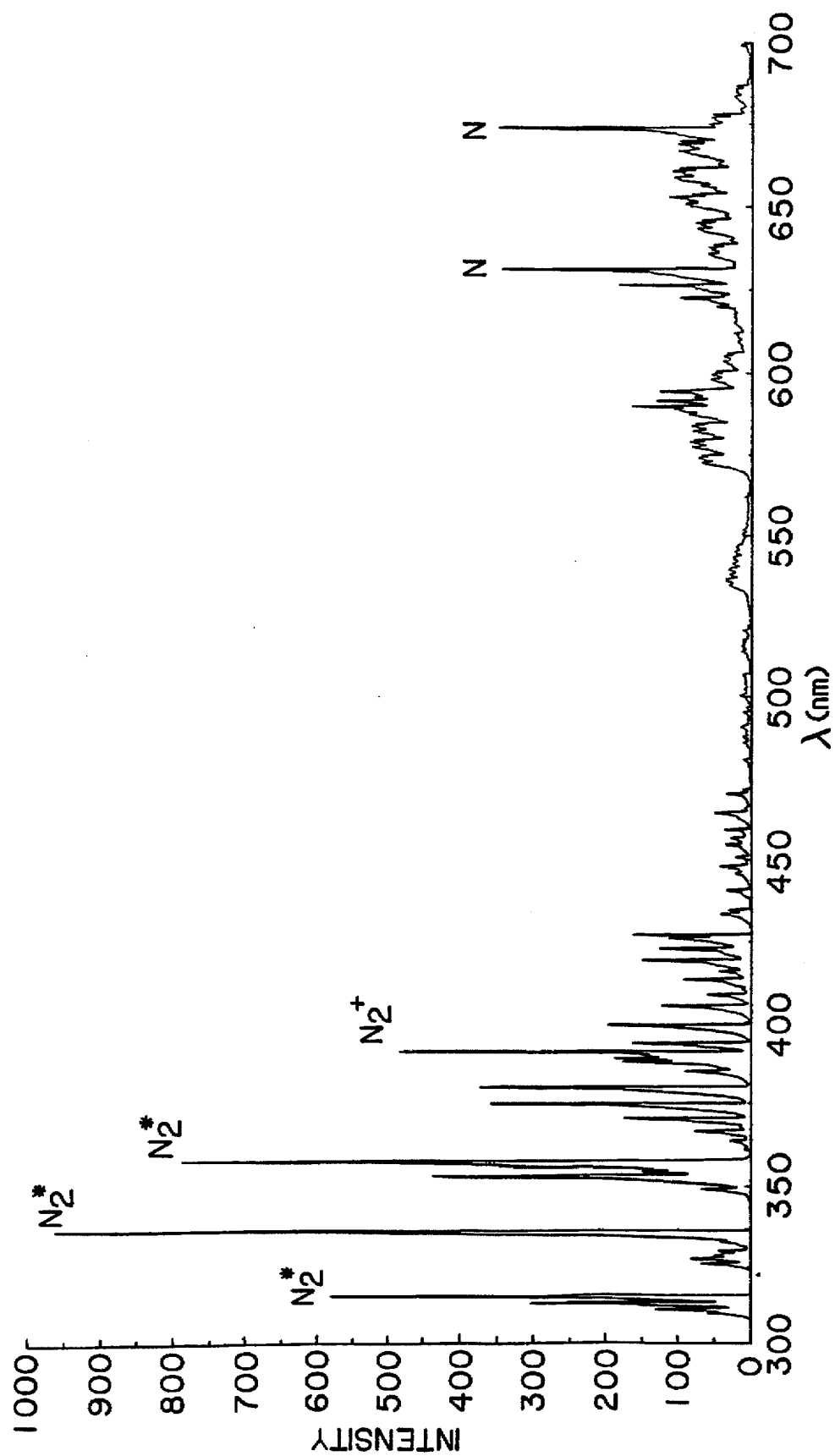
FIG. 10 is a graph illustrating an optical emission spectra for an ECR nitrogen plasma source operating with an exit aperture according to an embodiment of the present invention.

FIGS. 9 and 10 depict the effects of using exit apertures 42. FIG. 9 depicts an optical emission spectra for an ECR nitrogen plasma generated by a compact ECR-system 25 operated at 35 W, with a nitrogen pressure of about $1.2 \times 10^{-4}$ Torr without use of an exit aperture. This figure depicts the presence of ionic nitrogen ($N_2^+$) at about 391.4 nm, molecular excited nitrogen ($N_2^*$), and atomic nitrogen (N). The energy of the atomic nitrogen (N), occurring at wavelengths longer than about 650 nm, is relatively small. FIG. 10 depicts an optical emission spectra for an ECR nitrogen plasma generated by a compact ECR-system 25 having a 1 mm diameter exit aperture 42 in the exit aperture, operated at about 30 W. FIG. 10 depicts sharp peaks of atomic nitrogen at about 625 nm and about 670 nm. Further, the peak at about 391.4 nm for ionic nitrogen is reduced relative to the size of the atomic nitrogen peaks. As these figures indicate, the ratio of energetic ionic species to atomic species is reduced through the use of exit aperture 42. Although these figures depict results of ECR systems operated at different power levels, an ECR system operating with an exit aperture at 35 W would create even greater amounts of atomic nitrogen. Therefore, these figures show the increase in output of atomic nitrogen that is created by increasing the pressure in the ECR system through the use of an exit aperture. The reduced amount of ionic species reaching the substrate with the employment of exit aperture 42 having small holes, allows the ECR source to be operated at high powers (up to 500 W). This high power operation leads to more atomic nitrogen.

Figure 11:
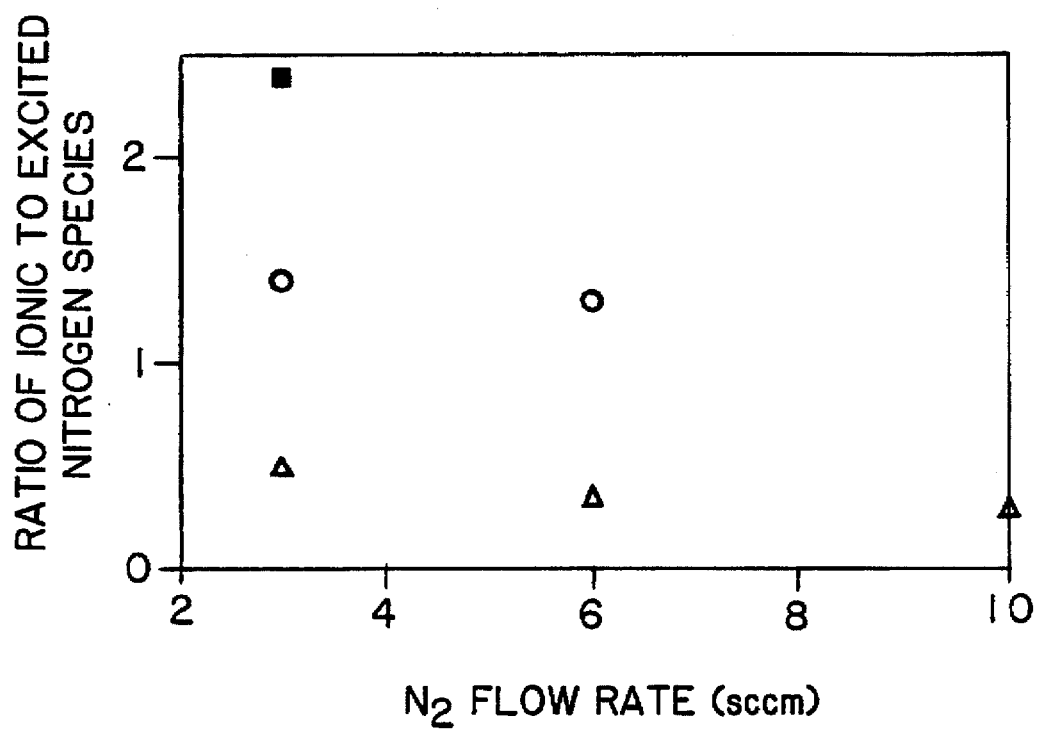
FIG. 11 is a graph illustrating relative ion emission intensity as a function of the nitrogen flow rate and aperture size of an ECR device according to one aspect of the present invention.

The effects of using the exit apertures 42 are also illustrated in FIG. 11. FIG. 11 depicts the ratio of ionic to excited nitrogen species taken for varying sizes of exit apertures 42 and varying rates of nitrogen flow. The squares represent a reading for an ECR source operating without an exit aperture. The circles represent readings for an ECR source operating with a 1 cm exit aperture. The triangles represent readings for an ECR source operating with a 1 mm exit aperture. As FIG. 11 illustrates, when the diameter of exit aperture 42 is smaller, relative ionic emission intensity is less, even for different nitrogen flow rates.

The employment of the external solenoid and/or the use of restricting exit apertures in the ECR-system allows the doping of the GAN n- or p-type without the use of the substrate biasing as discussed with reference to FIG. 3. Doping with an external magnet or a reduced diameter exit aperture may be accomplished by directing a beam of gallium, activated nitrogen, and the proper dopant toward the substrate.

Figure 12:
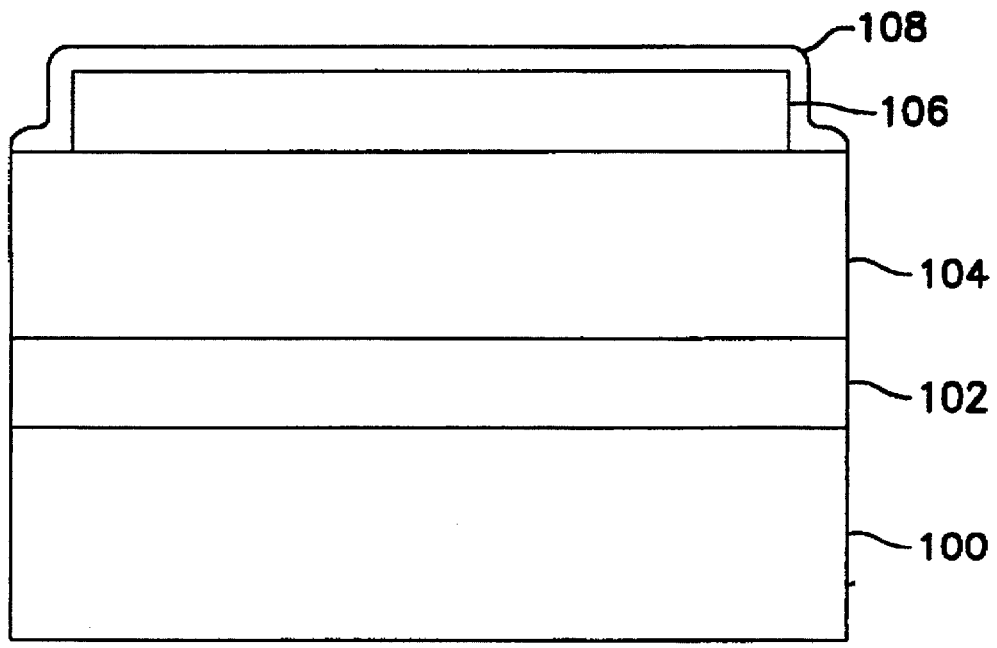
FIG. 12 is a cross sectional depiction of an example of an n-type GaN device.

A more detailed explanation of device 2 is now presented incorporating details of the ECR-assisted MBE method. FIG. 12 depicts device 2 in cross section and includes substrate 100, buffer layer 102, single crystal layer 104, electrodes 106 and antireflective coating 108.

Initially, the substrate 100 is placed in MBE system 11. If the substrate is sapphire, then the sapphire is preferably subjected to nitridation at a temperature on the order of 850° C. for example, to form atomically smooth AlN. Other methods of preparing the substrate for GaN growth may also be used. The preparation depends on the substrate used.

Once the substrate is prepared, the temperature in the MBE chamber is set at between about 100° C. and about 550° C. to perform a nucleation step to grow a buffer layer of desired thickness. In one embodiment of device 2, buffer layer 102 of GaN is grown at a temperature of about 550° C. to a thickness of about 400 Å. As described above, the temperature is one factor in determining whether the nucleation layer will be amorphous or defective crystalline. At this temperature, the activated nitrogen from an ECR-system and the atomic gallium generated by Knudsen effusion cell 22 are directed at the substrate 100. Other temperatures and thicknesses may be used.

Figure 13A:
FIG. 13(a)–(c) depict surface morphologies of films grown according to the present invention using an ECR source operating at different microwave powers.
Figure 13B:
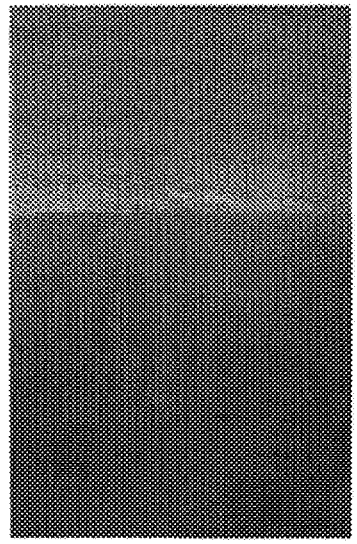
Figure 13C:
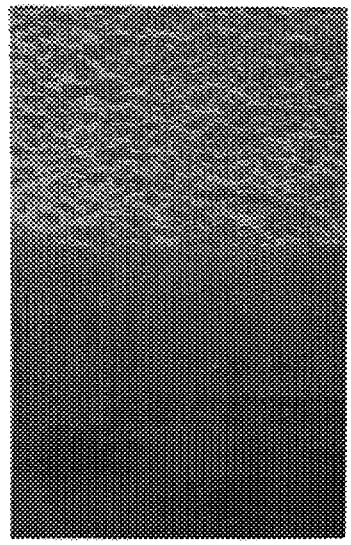

Preferably, compact ECR-system 25 is used to generate the activated nitrogen. The microwave power of the compact ECR-system 25 effects the type of growth which is induced. FIG. 13 depicts the effect of microwave power on the surface morphology of films. At 25,000 times magnification, FIG. 13(a) depicts the surface of a film grown at 18 W, FIG. 13(b) depicts the surface of a film grown at 20 W, and FIG. 13(c) depicts the surface of a film grown at 25 W. At 18 W, the film has a relatively island-like growth structure. The film grown at 20 W shows a relatively smooth surface typical for layer-by-layer growth. The film grown at 25 W shows a three dimensional growth which leads to rough surface morphologies. A power of about 20 W is preferred to provide smooth layer-by-layer growth as depicted in FIG. 13(b). Other powers may be used, however, depending upon desired parameters. For example, when an exit aperture in the ECR-system and/or the external solenoid is employed, the optimum power in the compact ECR system 25 is between about 30 to about 500 Watts and preferably between about 25–250 Watts.

After buffer layer 102 is grown, substrate 100 is heated gradually at a rate of about 4° C. every fifteen seconds. Other rates of increasing the temperature may also be used depending on the initial quality of the nucleation layer. For example, if the nucleation layer is amorphous, a slower rate of increasing the temperature may be used to ensure that the buffer layer crystallizes. The substrate is heated to the desired high temperature setting to perform one or more growth steps. A temperature in the range of about 600° C. to about 900° C., such as about 800° C., may be used, for example during the growth steps.

Before progressing to the growth step, it is important to determine whether the buffer layer has begun to crystallize. A reflection high-energy electron diffraction (RHEED) apparatus 46 (FIGS. 1, 3 and 4) may be used to monitor the crystallinity of the nucleation layer. For amorphous materials, it may be desirable to maintain the temperature at a predetermined high temperature for a predetermined period of time, such as at 800° C. for about 30 minutes, for example, before opening the gallium shutter to begin the growth step.

When the desired temperature is established, and the crystallinity of the nucleation layer has reached a desired level, the gallium shutter 23 is opened to begin growth of a single crystal layer 104 on the buffer layer 102. In one embodiment of device 2, the single crystal layer 104 is an n-type layer preferably grown to a thickness of about 1.0 –3.0 µm at a deposition rate of about 0.2 µm/hr, for example. In a prefered embodiment of device 2, shown in FIGS. 12 and 14, the n-type layer was grown at a temperature of about 800° C. to a thickness of about 2 µm. As described above, growth of n-type GaN may occur by autodoping or by introduction of a donor impurity. A doping level of between $10^{13}$–$10^{19}$ $cm^{-3}$ net carrier concentration may be used.

Once the layer 104 is grown to the desired thickness, the electrodes 106 are formed using standard photolithographic and lift-off techniques. To obtain optimum device performance, it is preferable to achieve stable, low resistance, ohmic contacts. Al is a suitable material for the formation of ohmic contacts on GaN. However, there is a limitation to the use of pure Al. That is, Al may diffuse into the semiconductor during annealing, a process important to achieving the low contact resistivity. Therefore, it is preferable to use a combination of Ti and Al to form the interdigitated electrodes 106. For instance, electrodes 106 may be formed by depositing a thin layer of Ti (approximately 200 angstroms) on the surface of device 2, followed by a layer of Al (approximately 2000 angstroms). These layers may be deposited at room temperature by electron-beam evaporation. After deposition the device is subjected to rapid thermal annealing (RTA) for about 30 seconds at a temperature of between about 700° C. to about 900° C., which results in a reduction in contact resistance by about three orders of magnitude. These contacts remain stable and ohmic for temperatures up to about 250° C.

Interdigitated electrodes 106 may be fabricated with a finger width, W, of between about 1 micrometer to about 100 micrometers and interelectrode spacing, S, of between about 1 micrometer to about 100 micrometers. The total surface area of the device may vary and preferably lies between about 0.6 to about 1 square millimeter. In one embodiment, the surface area of the device was 0.6 square millimeters and the finger width and the interelectrode spacing were both about 20 micrometers.

After electrode formation, the surface of device 2 is covered with an anti-reflective coating 108. GaN ordinarily reflects a substantial amount of light, i.e., about 20%. By incorporating anti-reflective coating 108 on the surface of device 2, the amount of light absorbed by the photodetector is increased. Therefore, the photon flux is increased. Suitable anti-reflective coatings will have an index of refraction equal to about the square root of the product of the refractive indices of film 104 on device 2, and the surrounding atmosphere. For a surrounding atmosphere of air, the coating should have a refractive index equal to about the square root of 3. $SiO_2$ or SiN are examples of materials which may be used as antireflective coatings. The anti-reflective coating is preferably applied so that its thickness is equal to about one fourth of the wavelength of operation. For instance, if device 2 is to be used in a photodetector to detect light having wavelengths in the ultraviolet range (about 200–400 nm), the anti-reflective coating will preferably be applied with a thickness of about 75 nm (one fourth of 300 nm). The anti-reflective coating can be deposited by ECR-assisted MBE, MOCVD, sputtering or any other suitable process.

The gain of the photodetector of FIG. 14 comes about because the recombination lifetime and transit time generally differ. Suppose that the holes are trapped in states due to defects and impurities and thus the electron-hole recombination lifetime is very long. In this scenario, an electron will move through the circuit many times before recombination. Therefore, absorption of a single photon results in an electron passing the external circuit many times. The expected number of trips the electron makes is the gain, G, and can be calculated as the recombination lifetime, τ; divided by the carrier transit time, $t_r$ $$G = \tau / t_r \quad (1)$$

The transit time depends on the physical dimensions of the device and can be calculated as the path length, L (electrode spacing), divided by the carrier drift velocity, $v_d$.

$$t_r = L / v_d \quad (2)$$

The drift velocity depends on the strength of the electric field across the semiconductor, E (which depends on the magnitude of the bias voltage, V), and the carrier mobility, µ.

$$v_d = \mu E = \mu V / L \quad (3)$$

Figure 15:
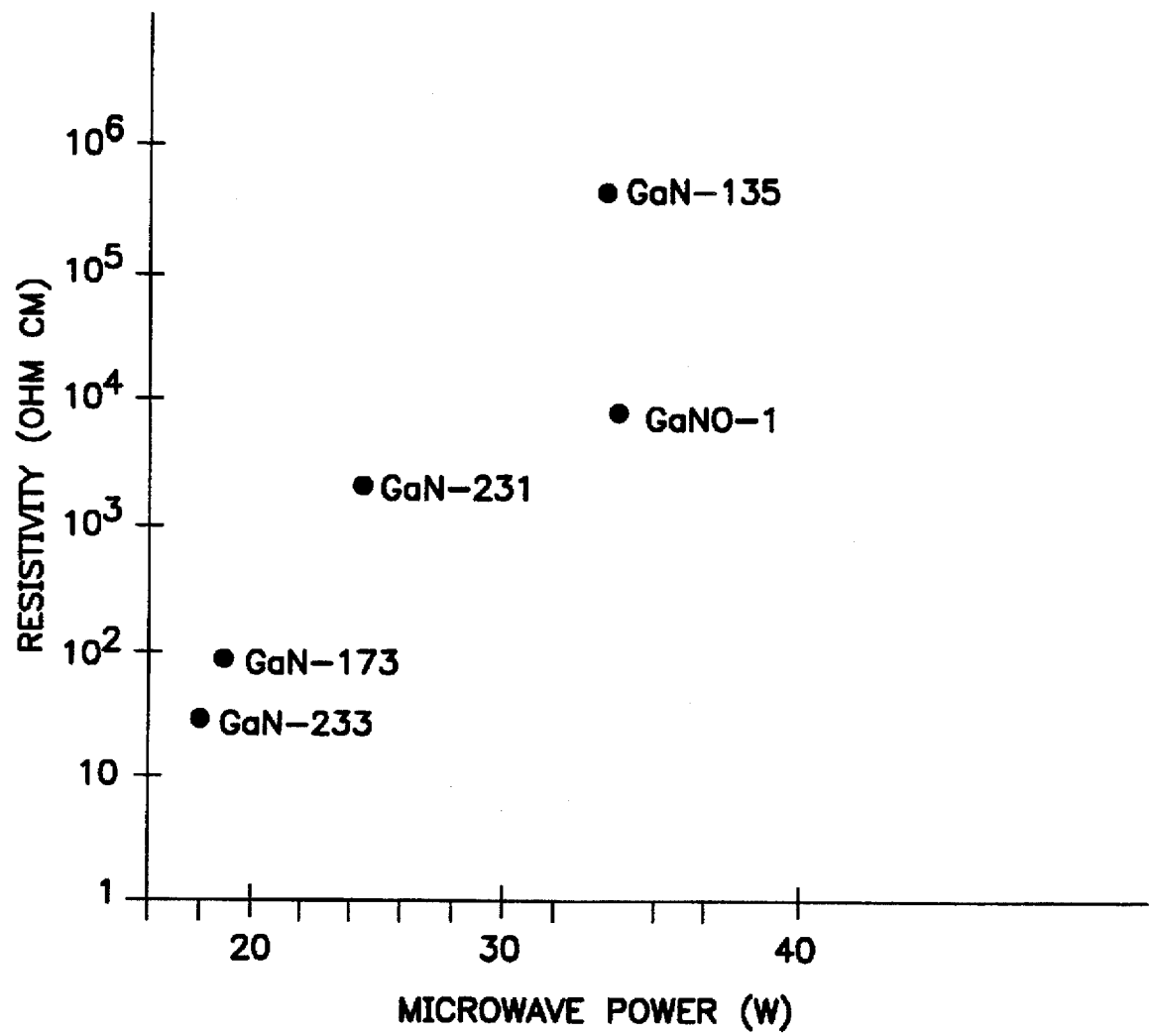
FIG. 15 is a graph illustrating the variance of GaN sample resistivity with microwave power used in the ECR-assisted MBE process.

The photocurrent in the circuit of FIG. 14 is then expressed by the following relationship:

$$I_{ph} = \eta q A I_o (1-R)(1-e^{-\alpha d}) G \quad (4)$$

where η=quantum efficiency
q=electron charge
A=detector area $I_o$=incident light intensity
R=reflectance of the material
α=absorption constant of the material
d=thickness As mentioned above, one advantage of using the ECR-assisted MBE process is that the gain of the photodetector can be controlled by adjusting the parameters of the ECR-assisted MBE process. For instance, the resistivity of the GaN can be varied by varying the microwave power. The resistivity of five samples of GaN is plotted against microwave power in FIG. 15. FIG. 15 shows that as the microwave power used in the ECR-assisted MBE process increased, the sample resistivity also increased. This control of sample resistivity allows the gain of the photodetector to be controlled. This is so, because the recombination lifetime, τ, depends on the resistance of the device.

The gain of a photodetector can be determined from equation (4) as all other quantities in that equation are either constant or readily measurable. Further, by substituting equations (2) and (3) into equation (1), the gain can be expressed as follows:

$$G=(\mu\tau)V/L^2 \quad (5)$$

Figure 16:
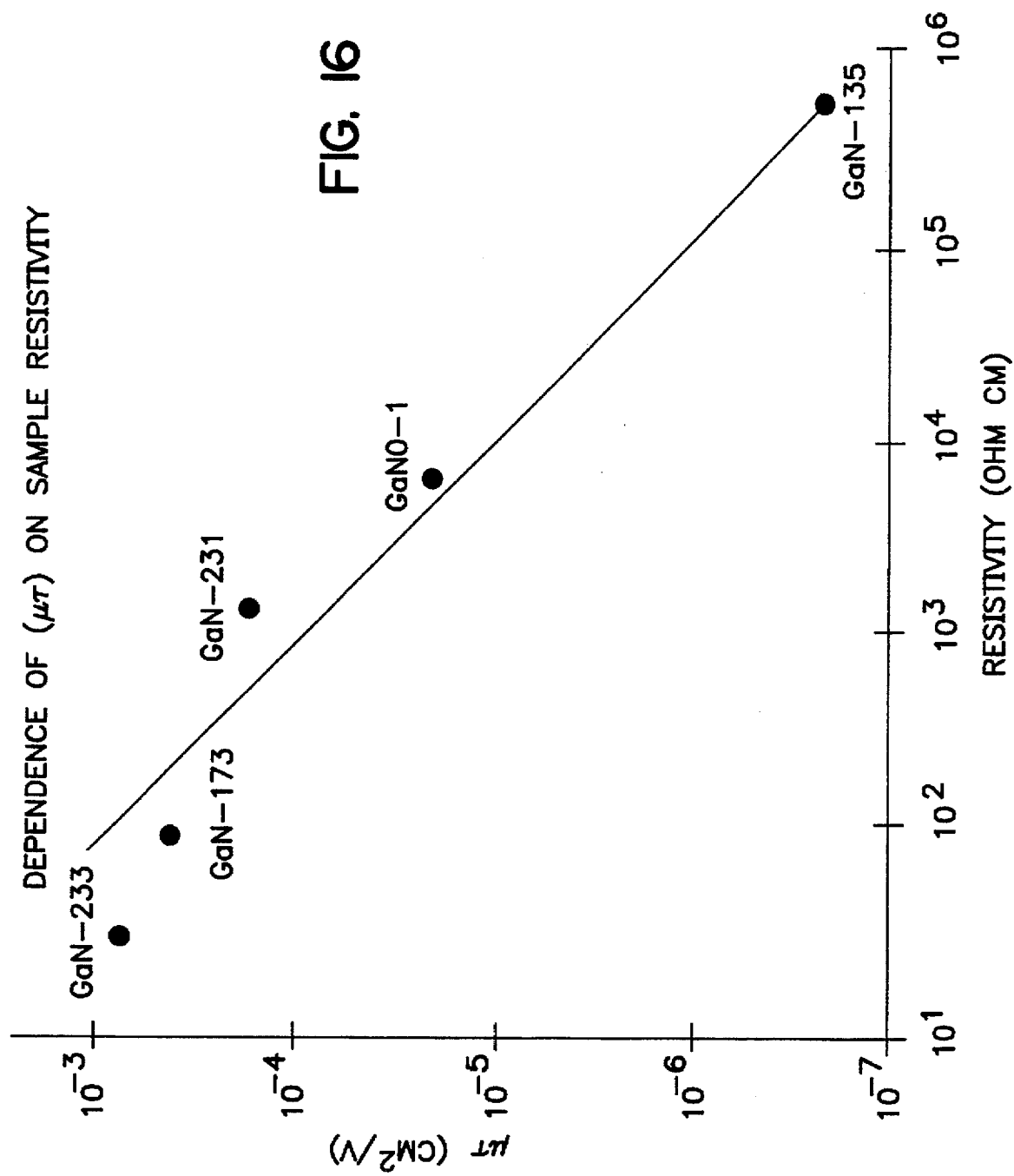
FIG. 16 is a graph of illustrating the dependence of ($\mu\tau$) on GaN sample resistivity.

The gain is influenced by the internal parameter, i.e. (μτ), as well as by circuit parameters of the photodetector, i.e. $V/L^2$. Various samples were tested and the results indicate that as the resistivity of the sample increased (by adjusting the deposition parameters), the product of the mobility and recombination lifetime (which can be determined from equation (5)) decreased. The mobility is generally thought to be constant. Therefore, a decrease in the recombination lifetime caused the decrease in (μτ). A graph of the test results showing the dependence of (μτ) on sample resistivity is shown in FIG. 16. By proper control of the sample resistance, photodetectors according to the preferred embodiments can achieve gains as high as 5000.

The resistivity of the sample can also be controlled by varying the flow rate of the $N_2$ in the ECR-assisted MBE process. That is, as the flow rate of the $N_2$ is decreased, the resistivity of the sample increases. Varying the $N_2$ flow rate could be used either as an alternative to, or in conjunction with, varying the microwave power.

Therefore, by varying parameters of the ECR-assisted MBE process in accordance with the data shown in FIGS. 15 and 16 the GaN can be given a predetermined resistivity. This predetermined resistivity in turn allows the gain and response time of the photodetector to be predetermined through the use of relationships (1)–(5).

The visible-blind nature of a photodetector is evidenced by its spectral response. The spectral response of a photodetector is determined by the frequency dependence of its photoresponse. The photoresponse is a function of wavelength principally because the absorption coefficient is a function of wavelength. For photons with energy less than the bandgap energy of the semiconductor, the photon energy is insufficient to excite carriers to overcome the bandgap and thus no absorption occurs. Thus the long wavelength limit of the spectral response is set by the bandgap of the material. For photons with energy greater than the bandgap, excess photocarriers, proportional to the incident excitation, are created. In most semiconductors, for very short wavelengths, the photoresponse decreases because the majority of the photons are absorbed near the surface of the device, where the recombination lifetime is short.

Figure 17:
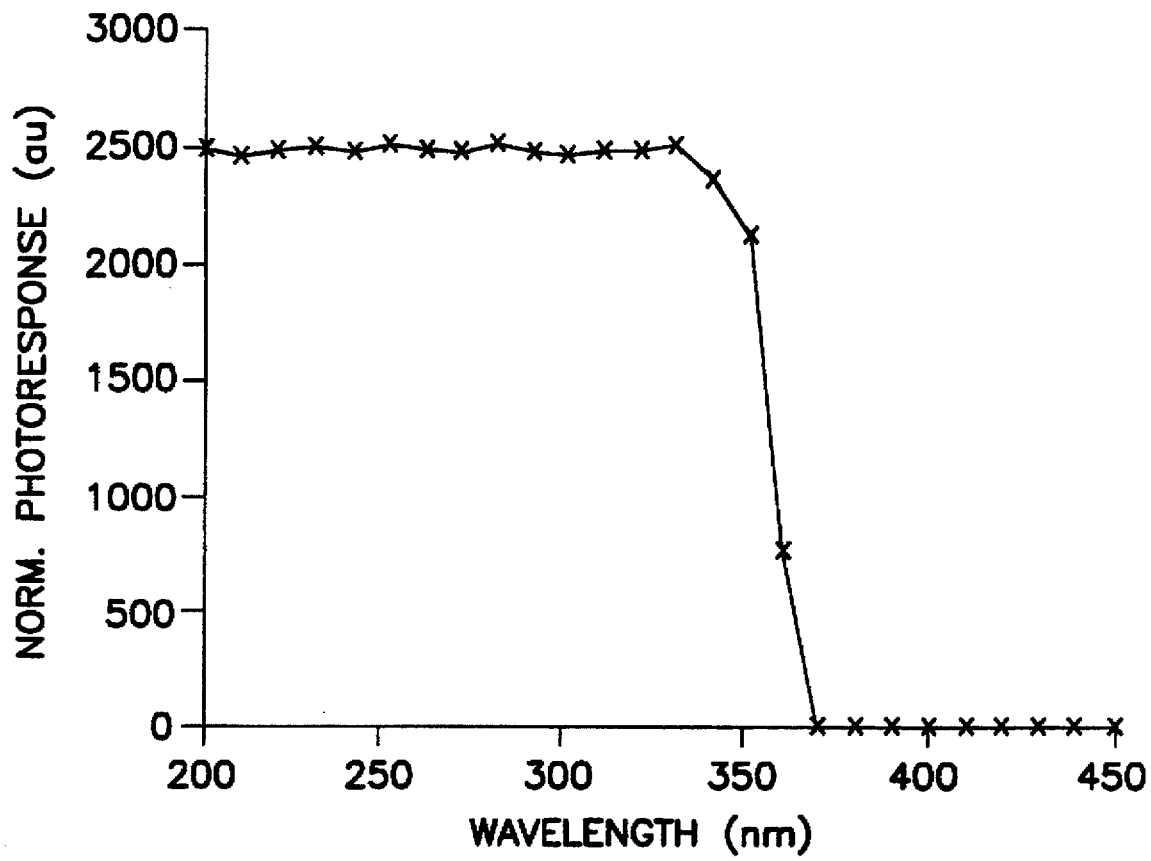
FIG. 17 is a graph illustrating a spectral response for a photodetector according to the first embodiment of the present invention.

FIG. 17 depicts the spectral response of photodetector 1. The spectral response was measured by using a UV-visible spectrometer that used a xenon lamp as the UV light source and a tungsten lamp as the visible light source. The photoresponse was calculated from measurements of photocurrent produced by the GaN detector as a function of wavelength and normalized to that produced by a calibrated UV-enhanced silicon photodiode of equal active area.

As can be seen from FIG. 17, the spectral response of photodetector 1 remains constant for wavelengths between about 200 nm to about 365 nm where the photoresponse drops sharply. The transition wavelength of 365 nm corresponds to the bandgap energy of GaN. The response shown in FIG. 17 indicates the visible-blind nature of the GaN detector. Further, such a spectral response indicates that surface states and surface recombination are not present in GaN.

The spectral response shown in FIG. 17 was obtained through the use of GaN alone. In other embodiments, a photodetector using an alloy of GaN and either InN or AlN can be used in place of GaN alone. Using an alloy of InN and GaN results in a spectral response of the same general shape as that shown in FIG. 17, but with the transition wavelength shifted to the right (i.e., in the direction of increasing wavelength). Use of this type of alloy enables such things as blue-violet detectors. Further, by varying the amount of InN in the alloy, the transition wavelength can be shifted all the way up to about 600 nm (corresponding to pure InN and a energy band gap of about 1.9 eV). In contrast, by using an alloy of AlN and GaN, the transition wavelength can be shifted to the left (i.e., in the direction of decreasing wavelength). As the amount of AlN in the alloy is increased, the transition wavelength can be decreased to about 200 nm (corresponding to pure AlN and an energy band gap of about 6.2 eV). In this way, the photodetector may be made completely solar-blind by shifting the transition wavelength to about 270 nm. Introduction of Al and In into GaN may be accomplished by evaporating these elements from dedicated effusion cells in the MBE chamber.

In another embodiment of photodetector, GaN with p-type doping may be used to form device 2. Operation of photodetectors having p-type doping is similar to the operation of photodetectors of having n-type doping. However, the formation of contacts is slightly different. To form an ohmic contact, the metal used generally has a work function approximately equal to the work function of the semiconductor (GaN in this case). The work function of the GaN with p-type doping is on the order of 7.5 eV. Platinum has the highest known work function of any metal at about 5.8 eV. Therefore, an electron tunneling method of contact formation is generally used to approximate an ohmic contact on a p-type semiconductor. To form an electron tunneling contact, a higher carrier concentration (on the order of $10^{19}$ $cm^{-3}$ –$10^{20}$ $cm^{-3}$) is used in the vicinity of the contacts to facilitate electron tunneling.

In another embodiment of photodetector, the three layers 21, 22 and 23 of device 2, shown in FIG. 14, may be replaced by a single n-type GaN substrate or by a GaN substrate having an GaN layer epitaxially formed thereon.

Figure 18:
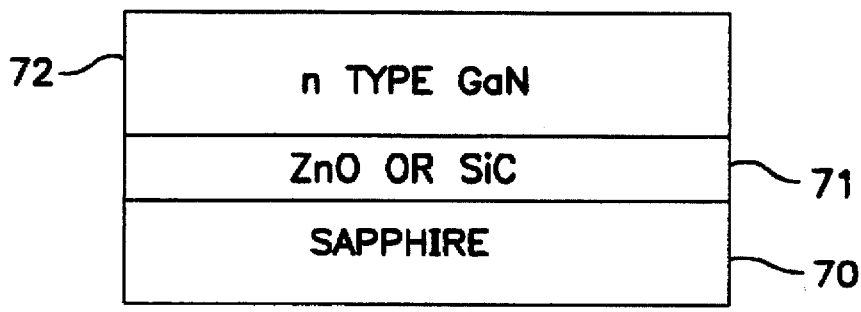
FIG. 18 depicts a growth structure by which a gallium nitride semiconductor may be produced.

One example of a method by which an n-type GaN substrate may be provided is explained in conjunction with FIG. 18. FIG. 18 depicts a growth structure by which a gallium nitride semiconductor may be produced. Beginning with a substrate 70, a dissolvable intermediate layer 71 is grown by sputtering or by ECR-assisted MBE. Substrate 70 may be sapphire, for example, but other substrates may also be used. Dissolvable intermediate layer 71 may be either ZnO or SiC, for example, but other dissolvable intermediate layers may also be used. If SiC is used, the SiC may be grown on the sapphire substrate by using a silicon on sapphire growth method. The Si is converted to SiC by exposure to methane at a temperature of about 800° C. to about 1000° C., for example.

Next, an n-type GaN substrate 72 is epitaxially grown on the ZnO or SiC by the chloride transport method, for example. The chloride method is given by the following equations.

$$2Ga + 2HCl \rightarrow 2GaCl + H_2$$

$$GaCl + NH_3 \rightarrow GaN + HCl + H_2$$

The chloride transport method generally is operated at high temperatures of about 1050° C. to about 1200° C. At about 1000° C., Ga—N bonds break from the GaN layer being formed on the ZnO or SiC layer. Therefore, nitrogen vacancies are created making the GaN substrate autodoped n-type. Also, intentional doping may be used by adding Si to the process, for example.

Preferably, the n-type GaN substrate 72 is doped to a carrier concentration level of about $10^{20}$ cm$^{-3}$, for example. A carrier concentration of about $10^{19}$ cm$^{-3}$ may also be used. Higher carrier concentrations may also be used.

N-type GaN substrate 72 is preferably grown to about 0.5 millimeters thick to provide a suitable substrate. The chloride transport method is advantageous because growth rates of about 0.5 mm/hr may be achieved. Therefore, a GaN substrate may be grown in about one hour. Other methods of growing a GaN layer may also be performed. For example, a GaN substrate may be provided by high pressure, high temperature formation by the reaction of liquid Ga with amonia. After GaN growth is complete, substrate 72 is separated by removing dissolvable layer 71 by using an appropriate acid or basic solution.

Once separated, the GaN substrate 72 is used to form device 2 shown in FIG. 14. In one embodiment, an epitaxial GaN layer is formed on substrate 72 and interdigitated electrodes 3 are formed thereon. The epitaxial layer may be formed using the above described ECR-assisted MBE process and may be either n-type or p-type. Alternatively, substrate 72 may be used without forming an additional epitaxial layer thereon. In that case, interdigitated electrodes 3 are formed directly on substrate 72.

Figure 19:
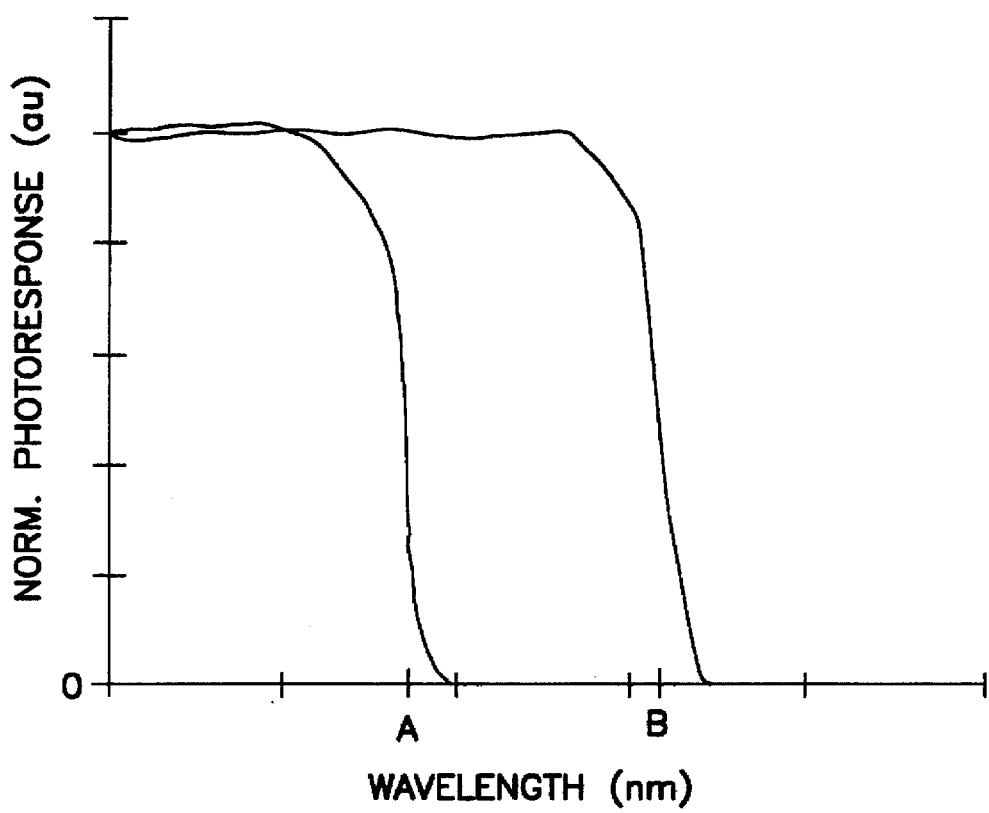
FIG. 19 is a graph illustrating a spectral response of a bandpass photodetector.

In still another embodiment, two independent detectors may be used together to form a band pass detector. The photoresponse of such a detector is shown in FIG. 19. Briefly, two detectors having the desired lower and upper transition wavelengths (noted as A and B respectively) are fabricated. For instance, this may be done by alloying GaN with InN and AlN. The two detectors may be grown independently on separate substrates, cut out and then mounted on a single substrate. Alternatively, the two detectors may be grown on the same substrate using the ECR-assisted MBE method and appropriate masking technology. As will be apparent to one of ordinary skill in the art, the photoresponses of the detectors may be adjusted so that incident light intensity can be determined within a particular narrow band of wavelengths, the spectral region A–B. Response in the spectral region A–B is accomplished by subtracting the outputs of the two independent detectors whose maximum photoresponses were adjusted to be the same. This could be accomplished through modification of parameters of the ECR-assisted MBE process and/or through the use of external circuitry.

Figure 20:
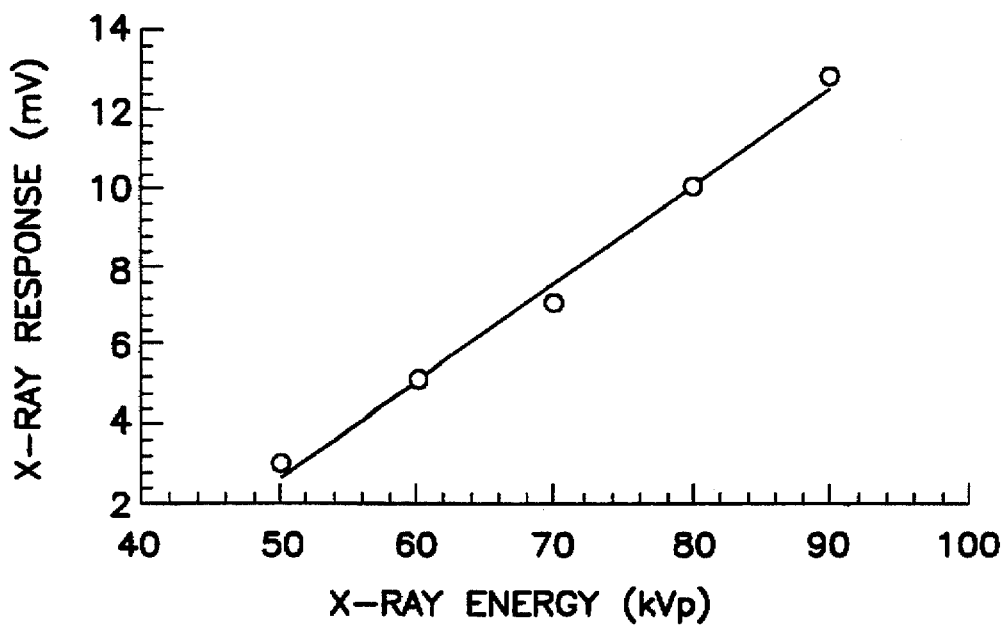
FIG. 20 is a graph illustrating the response of a GaN detector to x-ray photons as a function of x-ray photon energy at a bias voltage of 100 V.

In another embodiment, the above described photodetectors may also used to detect low energy x-rays. As an example, an x-ray tube capable of providing x-ray photons with energies that could be set from about 50 KVp to about 90 KVp was used as an x-ray source to irradiate a GaN photodetector. The output of the tube was filtered by an aluminum filter. The GaN photodetector was irradiated with x-rays, and the photocurrent generated in the detector was recorded as a function of bias voltage. FIG. 20 shows the response of the GaN photodetector to x-ray photons as a function of x-ray photon energy, at a bias voltage of 100 V. As can be seen from FIG. 20, the response of the GaN photodetector is linear.

In still another embodiment, the photodetectors described above could be used as alpha particle detectors. As an illustration of this, the GaN photodetector, whose response is described by FIG. 17, was also used to detect alpha particles. More specifically, in the experiment performed, a source of alpha particles having energy of about 5.5 MeV was used. Because the thickness of the detector was considerably smaller than the range of the alpha particles, the detector was inclined at an angle of 45° with respect to the alpha particle source. This configuration increased the amount of energy deposited in the GaN layer, by increasing the effective thickness of the detector whose actual thickness was about 2 microns. For an ideal alpha particle detector, the thickness of the detector should increase to about 100 microns. The results of this experiment indicate that GaN detectors can be used as single particle radiation detectors.

While this invention has been described with reference to specific embodiments, it is not intended that the invention be limited thereto. The invention is only limited by the claims which follow.

We claim:

1. A detector comprising at least one single crystal III-V nitride film deposited by electron cyclotron resonance microwave plasma-assisted molecular beam epitaxy, wherein the ($\mu\tau$) product of the detector is controlled by varying parameters of the deposition process for the single crystal film.

2. The detector of claim 1 being a UV detector.

3. The detector of claim 1 being an x-ray detector.

4. The detector of claim 1 being an alpha particle detector.

5. The detector of claim 1 being a visible light detector.

6. A photodetector comprising:

a III-V nitride film having a predetermined ($\mu\tau$) product;

a first electrode deposited on a surface of the film;

a second electrode deposited on the surface of the film, the second electrode being spaced from the first electrode; and, a voltage source connected across the first and second electrodes, said voltage source creating an electric field within the film;

wherein when the surface of the film upon which the electrodes are deposited is subjected to a photon illumination, electron hole pairs are created and flow within the film because of the electric field.

7. The photodetector of claim 6 wherein the III-V nitride film comprises a single crystal film.

8. The photodetector of claim 6 wherein the III-V nitride film comprises a buffer layer deposited on a sapphire substrate and a single crystal film deposited on the buffer layer whereby the predetermined ($\mu\tau$) product of the photodetector is controlled by varying parameters of the deposition process.

9. The photodetector of claim 6 wherein the III-V nitride film is deposited by electron cyclotron resonance microwave plasma-assisted molecular beam epitaxy.

10. The photodetector of claim 6 wherein the III-V nitride film is deposited by electron cyclotron resonance microwave plasma-assisted molecular beam epitaxy; and, wherein the resistivity of the film is controlled by varying the microwave power used in the electron cyclotron resonance microwave plasma-assisted molecular beam epitaxy process.

11. The photodetector of claim 6 wherein the III-V nitride film is deposited by electron cyclotron resonance microwave plasma-assisted molecular beam epitaxy; and, wherein the resistivity of the film is controlled by varying the nitrogen flow used in the electron cyclotron resonance microwave plasma-assisted molecular beam epitaxy process.

12. The photodetector of claim 6 wherein the first and second electrodes are deposited so as to form ohmic contacts on the surface of the film.

13. The photodetector of claim 6 wherein the III-V nitride film is fabricated from GaN.

14. The photodetector of claim 6 wherein the III-V nitride film is fabricated from an alloy of GaN and AlN.

15. The detector of claim 6 wherein the first and second electrodes are interdigitated.

16. The photodetector of claim 6 wherein the III-V nitride film is fabricated from an alloy of GaN and InN.

17. A method of making a photodetector having predetermined (µτ) product:

fabricating a III-V nitride film so as to control its resistivity;

depositing a first electrode on a surface of the film;

depositing a second electrode on the surface of the film, the second electrode being spaced from the first electrode; and, providing a voltage source connected across the first and second electrodes.

18. The method of claim 17 wherein the step of fabricating further comprises fabricating a single crystal film.

19. The method of claim 18 wherein the step of fabricating further comprises separating the single crystal III-V nitride film from the dissolvable layer.

20. The method of claim 17 wherein the step of fabricating further comprises fabricating a dissolvable layer on a substrate and fabricating a single crystal III-V nitride film on the dissolvable layer.

21. The method of claim 17 wherein the step of fabricating further comprises fabricating a buffer layer on a substrate and fabricating a single crystal film upon the buffer layer.

22. The method of claim 17 wherein the step of fabricating comprises electron cyclotron resonance plasma-assisted molecular beam epitaxy.

23. The method of claim 17 wherein the predetermined (µτ) product is controlled by varying parameters of the fabricating step.

24. The method of claim 22 wherein the predetermined (µτ) product of the photodetector is controlled by varying the microwave power used in the electron cyclotron resonance microwave plasma-assisted molecular beam epitaxy process.

25. The method of claim 22 wherein the predetermined (µτ) product of the photodetector is controlled by varying the nitrogen flow used in the electron cyclotron resonance microwave plasma-assisted molecular beam epitaxy process.

26. The method of claim 17 wherein the first and second electrodes are deposited so as to form ohmic contacts.

27. The method of claim 17 wherein the step of fabricating further comprises fabricating the III-V nitride film from GaN.

28. The method of claim 17 wherein the step of fabricating further comprises fabricating the III-V nitride film from an alloy of GaN and AlN.

29. The method of claim 17 wherein the step of fabricating further comprises fabricating the III-V nitride film from an alloy of GaN and InN.

30. The method of claim 17 wherein the steps of depositing first and second electrodes further comprises:

depositing a first electrode on the surface of the film, said first electrode having fingers;

depositing a second electrode on the surface of the film, said second electrode having fingers, said fingers of said second electrode being interdigitated with said fingers of said first electrode.

* * * * *